(12) United States Patent
Kim et al.

(10) Patent No.: US 9,875,932 B2
(45) Date of Patent: Jan. 23, 2018

(54) METHODS OF FORMING CONTACT HOLES USING PILLAR MASKS AND MASK BRIDGES

(71) Applicant: Samsung Electronics Co., Ltd., Suwon-si, Gyeonggi-do (KR)

(72) Inventors: Nam-Gun Kim, Yongin-si (KR); Chan-Mi Lee, Suwon-si (KR)

(73) Assignee: Samsng Electronics Co., Ltd. (KR)

( * ) Notice: Subject to any disclaimer, the term of this patent is extended or adjusted under 35 U.S.C. 154(b) by 0 days.

(21) Appl. No.: 15/277,636

(22) Filed: Sep. 27, 2016

(65) Prior Publication Data

US 2017/0133266 A1    May 11, 2017

(30) Foreign Application Priority Data

Nov. 6, 2015    (KR) .......................... 10-2015-0155993

(51) Int. Cl.
| | |
|---|---|
| *H01L 21/768* | (2006.01) |
| *H01L 21/311* | (2006.01) |
| *H01L 27/108* | (2006.01) |
| *H01L 27/11* | (2006.01) |

(52) U.S. Cl.
CPC .. *H01L 21/76877* (2013.01); *H01L 21/31144* (2013.01); *H01L 21/76816* (2013.01); *H01L 27/108* (2013.01); *H01L 27/11* (2013.01)

(58) Field of Classification Search
CPC ......... H01L 21/76877; H01L 21/76816; H01L 21/76897; H01L 21/76898; H01L 21/823475; H01L 21/823871; H01L 21/31144; H01L 21/311; H01L 27/108; H01L 27/11; H01L 23/49827
See application file for complete search history.

(56) References Cited

U.S. PATENT DOCUMENTS

| | | | |
|---|---|---|---|
| 7,183,603 B2 | 2/2007 | Park | |
| 7,247,906 B2 | 7/2007 | Park et al. | |
| 7,972,956 B2 | 7/2011 | Kang et al. | |
| 8,093,125 B2 | 1/2012 | Kim | |
| 8,581,337 B2 | 11/2013 | Kye et al. | |
| 8,759,906 B2 * | 6/2014 | Sung ................. | H01L 27/10876 257/329 |
| 8,865,547 B2 | 10/2014 | Kang | |

(Continued)

FOREIGN PATENT DOCUMENTS

| | | |
|---|---|---|
| KR | 10-2012-0003741 A | 1/2012 |
| KR | 10-2012-0004605 A | 1/2012 |

(Continued)

*Primary Examiner* — Andrew Q Tran
(74) *Attorney, Agent, or Firm* — Myers Bigel, P.A.

(57) ABSTRACT

A fabrication method of the semiconductor device comprises forming an isolation layer and an active region, which is defined by the isolation layer, on a substrate, forming an insulating layer on the substrate, forming a plurality of pillar masks, which are spaced from one another by a first gap and a second gap that is smaller than the first gap, on the insulating layer, forming spacers on the plurality of pillar masks, forming mask bridges in regions where the plurality of pillar masks are spaced from one another by the second gap by partially removing the spacers and forming a contact hole, which exposes the active region, by etching the insulating layer using the plurality of pillar masks and the mask bridges.

20 Claims, 39 Drawing Sheets

(56) References Cited

U.S. PATENT DOCUMENTS

| | | |
|---|---|---|
| 8,906,763 B2 | 12/2014 | Park et al. |
| 8,969,936 B2 | 3/2015 | Lee et al. |
| 9,070,705 B2 | 6/2015 | Banerjee et al. |
| 2008/0299722 A1 | 12/2008 | Hartwich et al. |
| 2013/0009226 A1 | 1/2013 | Park et al. |
| 2014/0008719 A1 | 1/2014 | Jeong |
| 2014/0061939 A1 | 3/2014 | Yu et al. |
| 2014/0110816 A1 | 4/2014 | Kim et al. |
| 2014/0203357 A1 | 7/2014 | Kim et al. |
| 2014/0264727 A1 | 9/2014 | Kim et al. |
| 2015/0004774 A1 | 1/2015 | Kang |
| 2015/0126013 A1 | 5/2015 | Hwang et al. |
| 2016/0005659 A1* | 1/2016 | Song .............. H01L 21/823475 438/299 |

FOREIGN PATENT DOCUMENTS

| | | |
|---|---|---|
| KR | 10-1161770 B1 | 6/2012 |
| KR | 10-2012-0076913 A | 7/2012 |
| KR | 10-2014-0091845 A | 7/2014 |

\* cited by examiner (a)

(b)

(a)

(b)

(a)

(b)

(a)

(b)

(a)

(b)

METHODS OF FORMING CONTACT HOLES USING PILLAR MASKS AND MASK BRIDGES

This application claims priority to Korean Patent Application No. 10-2015-0155993 filed on Nov. 6, 2015 in the Korean Intellectual Property Office, the disclosure of which is incorporated herein by reference in its entirety.

BACKGROUND

The inventive concepts relate to semiconductor devices and fabrication methods thereof, and more particularly, to semiconductor devices having contact holes, fabrication methods of the semiconductor devices, and methods of forming the contact holes.

As the integration density of semiconductor devices continues to increase, the design rules for components of the semiconductor devices continue to be reduced. In particular, a gate length, which is a standard for the design rules for semiconductor devices that include a large number of transistors, continues to decrease, and the size of contact holes for electrically connecting conductive layers on different levels continues to decrease.

SUMMARY

Example embodiments of the inventive concepts can provide semiconductor devices with improved reliability and fabrication methods thereof.

Example embodiments of the inventive concepts can also provide semiconductor devices, which can reduce or prevent bit line contact defects so as to allow improved reliability, and fabrication methods thereof.

Example embodiments of the inventive concepts can also provide methods of forming contact holes, which are capable of forming a contact hole of a particular shape.

However, example embodiments of the inventive concepts are not restricted to those set forth herein. The above and other example embodiments of the inventive concepts will become more apparent to one of ordinary skill in the art to which the inventive concepts pertain by referencing the detailed description of the inventive concepts given below.

An example embodiment of the inventive concepts provides a fabrication method of a semiconductor device, the fabrication method comprising forming an isolation layer and an active region, which is defined by the isolation layer, on a substrate, forming an insulating layer on the isolation layer and the active region, forming a plurality of pillar masks, which are spaced from one another by a first gap and a second gap that is smaller than the first gap, on the insulating layer, forming spacers on the plurality of pillar masks, forming mask bridges in regions where the plurality of pillar masks are spaced from one another by the second gap by partially removing the spacers and forming a contact hole, which exposes the active region, by etching the insulating layer using the plurality of pillar masks and the mask bridges.

In some embodiments of the inventive concepts, the forming the spacers comprises conformally forming the spacers on the plurality of pillar masks.

In some embodiments of the inventive concepts, the forming the spacers comprises forming the spacers to be merged in the regions where the plurality of pillar masks are spaced from one another by the second gap.

In some embodiments of the inventive concepts, the forming the mask bridges comprises forming the mask bridges using the spacers that are merged.

In some embodiments of the inventive concepts, the spacers have a first thickness and the second gap is 2 times or less larger than the first thickness.

In some embodiments of the inventive concepts, the first gap is 2 to 4 times larger than the second gap.

In some embodiments of the inventive concepts, the plurality of pillar masks have a first diameter in a first direction and a second diameter, which is smaller than the first diameter, in the second direction, which is perpendicular to the first direction.

In some embodiments of the inventive concepts, the first diameter is 1 to 1.3 times larger than the second diameter.

In some embodiments of the inventive concepts, the forming the plurality of pillar masks comprises forming first through fourth pillar masks, which are adjacent to one another, and the forming the first through fourth pillar masks comprises forming the first and second pillar masks in a first direction and forming the third and fourth pillar masks in a second direction, which is perpendicular to the first direction.

In some embodiments of the inventive concepts, the first gap includes a first direction gap and a second direction gap, which is smaller than the first direction gap, the first direction gap extending between the first and second pillar masks, and the second direction gap extending between the third and fourth pillar masks.

In some embodiments of the inventive concepts, the first direction gap is 1.2 to 1.6 times larger than the second direction gap.

In some embodiments of the inventive concepts, the plurality of pillar masks comprise at least one of silicon oxide, silicon nitride, polysilicon, or a Spin-On-Hardmask (SOH) material.

In some embodiments of the inventive concepts, the fabrication method further comprises forming a bit line contact in the contact hole and forming a bit line on the bit line contact.

In some embodiments of the inventive concepts, the plurality of pillar masks are circular pillars, elliptical pillars and/or rectangular pillars with rounded corners.

In some embodiments of the inventive concepts, the plurality of pillar masks are rectangular pillars with rounded corners and comprise a pair of adjacent pillar masks having their respective corners facing each other and a pair of adjacent pillar masks having their respective sides facing each other.

In some embodiments of the inventive concepts, the first gap is a gap between the pair of adjacent pillar masks having their respective corners facing each other and the second gap is a gap between the pair of adjacent pillar masks having their respective sides facing each other.

In some embodiments of the inventive concepts, the first gap is 2 to 4 times larger than the second gap.

In some embodiments of the inventive concepts, the forming the mask bridges comprises exposing part of a top surface of the insulating layer by partially removing the spacers, and the exposed part of the top surface of the insulating layer is rectangular.

In some embodiments of the inventive concepts, the forming the contact hole comprises forming a rectangular contact hole by etching the exposed part of the top surface of the insulating layer.

According to other example embodiments of the inventive concepts a fabrication method of a semiconductor device comprises forming an isolation layer and an active region, which is defined by the isolation layer, on a substrate, forming an insulating layer on the isolation layer and the active region, forming first through fourth pillar masks, which surround an area of the insulating layer and are spaced from one another by a first gap and a second gap that is smaller than the first gap, on the insulating layer, forming spacers on the first through fourth pillar masks, forming mask bridges in regions where the first through fourth pillar masks are spaced from one another by the second gap by partially removing the spacers and forming a contact hole, which exposes the active region, by etching the insulating layer using the first through fourth pillar masks and the mask bridges, wherein the forming the contact hole comprises forming a rectangular contact hole by etching a top surface of the area of the insulating layer that is exposed by the first through fourth pillar masks and the mask bridges.

In some embodiments of the inventive concepts, the forming the spacers comprises forming the spacers to be merged in regions where the first through fourth pillar masks are spaced from one another by the second gap.

In some embodiments of the inventive concepts, the forming the mask bridges comprises forming the mask bridges using the spacers that are merged.

In some embodiments of the inventive concepts, the spacers have a first thickness and the second gap is 2 times or less larger than the first thickness.

In some embodiments of the inventive concepts, the first gap is 2 to 4 times larger than the second gap.

In some embodiments of the inventive concepts, the forming the first through fourth pillar masks comprises forming the first and second pillar masks in a first direction and forming the third and fourth pillar masks in a second direction, which is perpendicular to the first direction.

In some embodiments of the inventive concepts the first gap includes a first direction gap and a second direction gap, which is smaller than the first direction gap, the first direction gap extending between the first and second pillar masks, and the second direction gap extending between the third and fourth pillar masks.

In some embodiments of the inventive concepts, the first direction gap is 1.2 to 1.6 times larger than the second direction gap.

In some embodiments of the inventive concepts, the first through fourth pillar masks are rectangular pillars with rounded corners, the first and second pillar masks have their respective corners facing each other, and the third and fourth pillar masks have their respective sides facing each other.

In some embodiments of the inventive concepts, the first through fourth pillar masks have a first diameter in the first direction and a second diameter in the second direction and the first diameter is 1 to 1.3 times larger than the second diameter.

Other example embodiments of the inventive concepts provide a fabrication method of a semiconductor device comprising forming isolation layers and a plurality of active regions, which are defined by the isolation layers and are spaced from one another, on a substrate, forming a plurality of gate electrode lines, which intersect the plurality of active regions, forming an insulating layer on the substrate, forming a plurality of pillar masks, which are spaced from one another by a first gap and a second gap that is smaller than the first gap, on the insulating layer, forming spacers on the plurality of pillar masks, forming mask bridges in regions where the plurality of pillar masks are spaced from one another by the second gap by partially removing the spacers, forming contact holes, which expose the plurality of active regions, by etching the insulating layer among the plurality of gate electrode lines using the plurality of pillar masks and the mask bridges, forming bit line contacts in the contact holes, and forming bit lines, which intersect at least one of the plurality of gate electrode lines, on the bit line contacts.

In some embodiments of the inventive concepts, the forming the spacers comprises conformally forming the spacers on the plurality of pillar masks to be merged in the regions where the plurality of pillar masks are spaced from one another by the second gap.

In some embodiments of the inventive concepts, the forming the mask bridges comprises forming the mask bridges using the spacers that are merged, the spacers have a first thickness, and the second gap is 2 times or less larger than the first thickness.

In some embodiments of the inventive concepts, the first gap is 2 to 4 times larger than the second gap.

In some embodiments of the inventive concepts, the plurality of pillar masks have a first diameter in a first direction and a second diameter, which is smaller than the first diameter, in the second direction, which is perpendicular to the first direction.

In some embodiments of the inventive concepts, the first diameter is 1 to 1.3 times larger than the second diameter.

In some embodiments of the inventive concepts, the forming the plurality of pillar masks comprises forming first through fourth pillar masks, which are adjacent to one another, the forming the first through fourth pillar masks, comprising forming the first and second pillar masks in a first direction and forming the third and fourth pillar masks in a second direction, which is perpendicular to the first direction, the first gap including a first direction gap and a second direction gap, which is smaller than the first direction gap, the first direction gap extending between the first and second pillar masks, and the second direction gap extending between the third and fourth pillar masks.

In some embodiments of the inventive concepts, the first direction gap is 1.2 to 1.6 times larger than the second direction gap.

According to other example embodiments of the inventive concepts, a method of forming a contact hole comprises forming a plurality of pillar masks, which are spaced from one another by a first gap and a second gap that is smaller than the first gap, on a target layer, conformally forming spacers, which have a first thickness, on the plurality of pillar masks to be merged in regions where the plurality of pillar masks are spaced from one another by the second gap, forming mask bridges in the regions where the first through fourth pillar masks are spaced from one another by the second gap by partially removing the spacers that are merged and forming a contact hole by etching the target layer using the plurality of pillar masks and the mask bridges, wherein the second gap is 2 times or less larger than the first thickness.

In some embodiments of the inventive concepts, the first gap is 2 to 4 times larger than the second gap.

In some embodiments of the inventive concepts, the plurality of pillar masks have a first diameter in a first direction and a second diameter, which is smaller than the first diameter, in the second direction, which is perpendicular to the first direction.

In some embodiments of the inventive concepts, the first diameter is 1 to 1.3 times larger than the second diameter.

In some embodiments of the inventive concepts, the forming the plurality of pillar masks comprises forming first through fourth pillar masks, which are adjacent to one another, and the forming the first through fourth pillar masks comprises forming the first and second pillar masks in a first direction and forming the third and fourth pillar masks in a second direction, which is perpendicular to the first direction.

In some embodiments of the inventive concepts, the first gap includes a first direction gap and a second direction gap, which is smaller than the first direction gap, the first direction gap extending between the first and second pillar masks, and the second direction gap extending between the third and fourth pillar masks.

In some embodiments of the inventive concepts, the first direction gap is 1.2 to 1.6 times larger than the second direction gap.

In some embodiments of the inventive concepts, the plurality of pillar masks comprise circular pillars, elliptical pillars and/or rectangular pillars with rounded corners.

In some embodiments of the inventive concepts, the plurality of pillar masks are rectangular pillars with rounded corners and comprise a pair of adjacent pillar masks having their respective corners facing each other and a pair of adjacent pillar masks having their respective sides facing each other.

In some embodiments of the inventive concepts, the first gap is a gap between the pair of adjacent pillar masks having their respective corners facing each other and the second gap is a gap between the pair of adjacent pillar masks having their respective sides facing each other.

In some embodiments of the inventive concepts, the first gap is 2 to 4 times larger than the second gap.

According to other example embodiments of the inventive concepts, a semiconductor device comprises a substrate including isolation layers and a plurality of active regions, which are defined by the isolation layers and are spaced from one another, a plurality of gate electrode lines, on the plurality of active regions and extending in a second direction to intersect the plurality of active regions, a plurality of bit lines on the plurality of active regions and arranged among the plurality of gate electrode lines and extending in a first direction to intersect the plurality of active regions, the first direction being different from the second direction and a plurality of bit line contacts, which are disposed between the plurality of bit lines and the plurality of active regions and have top surfaces that are electrically connected to the plurality of bit lines, wherein the top surfaces of the plurality of bit line contacts include rectangular top surfaces and non-rectangular top surfaces.

In some embodiments of the inventive concepts, the plurality of bit line contacts are arranged in a lattice form to be spaced from one another.

According to yet other example embodiments of the inventive concepts, a fabrication method of a semiconductor device comprises forming an insulating layer on a substrate, forming a plurality of spaced apart pillar masks on the insulating layer, a given pillar mask being spaced apart from a first pillar mask that is adjacent thereto by a first distance and being spaced apart from a second pillar mask that is adjacent thereto by a second distance that is greater than the first distance, forming a mask bridge that bridges the first distance so as to connect the given pillar mask to the first pillar mask but does not bridge the second distance so that the given pillar mask is not connected to the second pillar mask by the mask bridge, and etching the insulating layer using the plurality of spaced apart pillar masks and the mask bridge as an etch mask to form a contact hole in the insulating layer.

In some embodiments of the inventive concepts, the forming a mask bridge comprises forming a spacer layer that is at least one half as thick as the first distance, conformally on the plurality of spaced apart pillar masks, and partially removing the spacer layer so that the spacer layer remains between the given pillar mask and the first pillar mask but does not remain between the given pillar mask and the second pillar mask.

In some embodiments, the given first and second pillar masks are rectangular pillar masks having sides and corners, wherein a side of the given pillar mask faces a side of the first pillar mask to define the first distance and wherein a corner of the given pillar mask faces a corner of the second pillar mask to define the second distance.

In some embodiments of the inventive concepts, the given, first and second pillar masks are elliptical pillar masks having major axes that all extend along a first direction and minor axes that all extend along a second direction that is different from the first direction, wherein the first distance does not extend along the first direction or the second direction and wherein the second distance extends along the first direction or the second direction.

In some embodiments of the inventive concepts, the method further comprises forming a bit line contact of a memory device in the contact hole.

Other features and aspects will be apparent from the following detailed description, the drawings, and the claims.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF THE EMBODIMENTS

Figure 1:
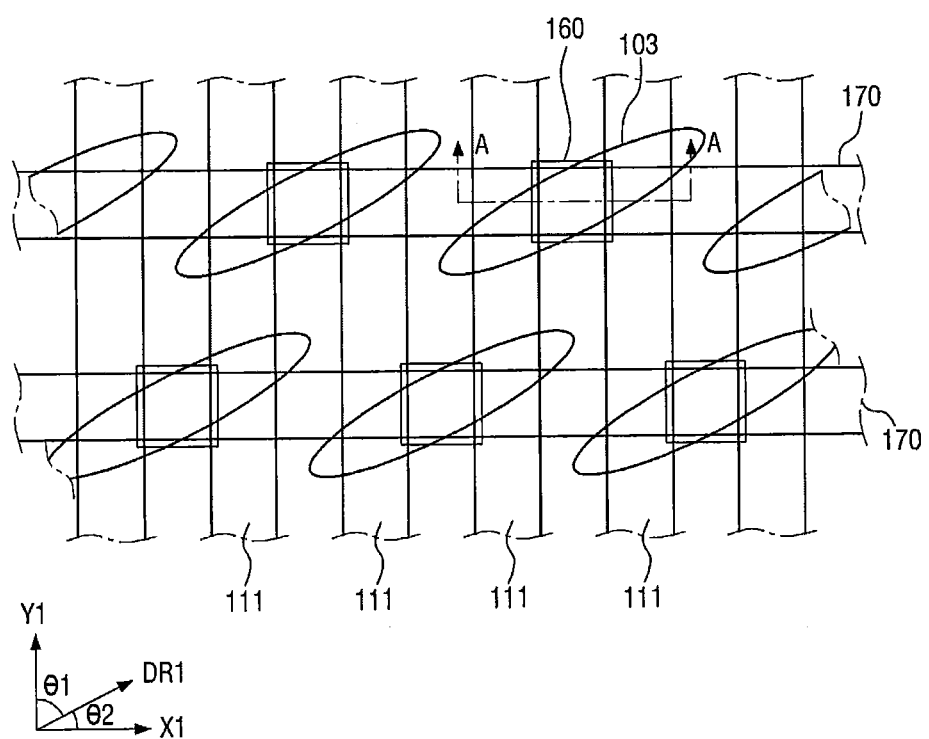
FIG. 1 is a layout view of a semiconductor device according to some example embodiments of the inventive concepts.

Advantages and features of the present inventive concepts and methods of accomplishing the same may be understood more readily by reference to the following detailed description of various embodiments and the accompanying drawings. The present inventive concepts may, however, be embodied in many different forms and should not be construed as being limited to the embodiments set forth herein.

Rather, these embodiments are provided so that this disclosure will be thorough and complete and will fully convey the concepts of the disclosure to those skilled in the art, and the present inventive concepts will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" (and variants thereof) are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Semiconductor devices, fabrication methods thereof, and methods of forming contact holes according to example embodiments of the inventive concepts will hereinafter be described with reference to the accompanying drawings. The methods of forming contact holes may be embodied by the formation of bit line contact holes for forming bit line contacts, but the inventive concepts are not limited thereto. That is, various holes for various purposes may be formed by the methods of forming contact holes.

A semiconductor device according to some example embodiments of the inventive concepts will hereinafter be described with reference to FIGS. 1 through 3.

FIG. 1 is a layout view of a semiconductor device according to some example embodiments of the inventive concepts. FIG. 2 is a cross-sectional view taken along line A-A' of FIG. 1. FIG. 3 is a circuit diagram of the semiconductor device of FIG. 1.

Figure 2:
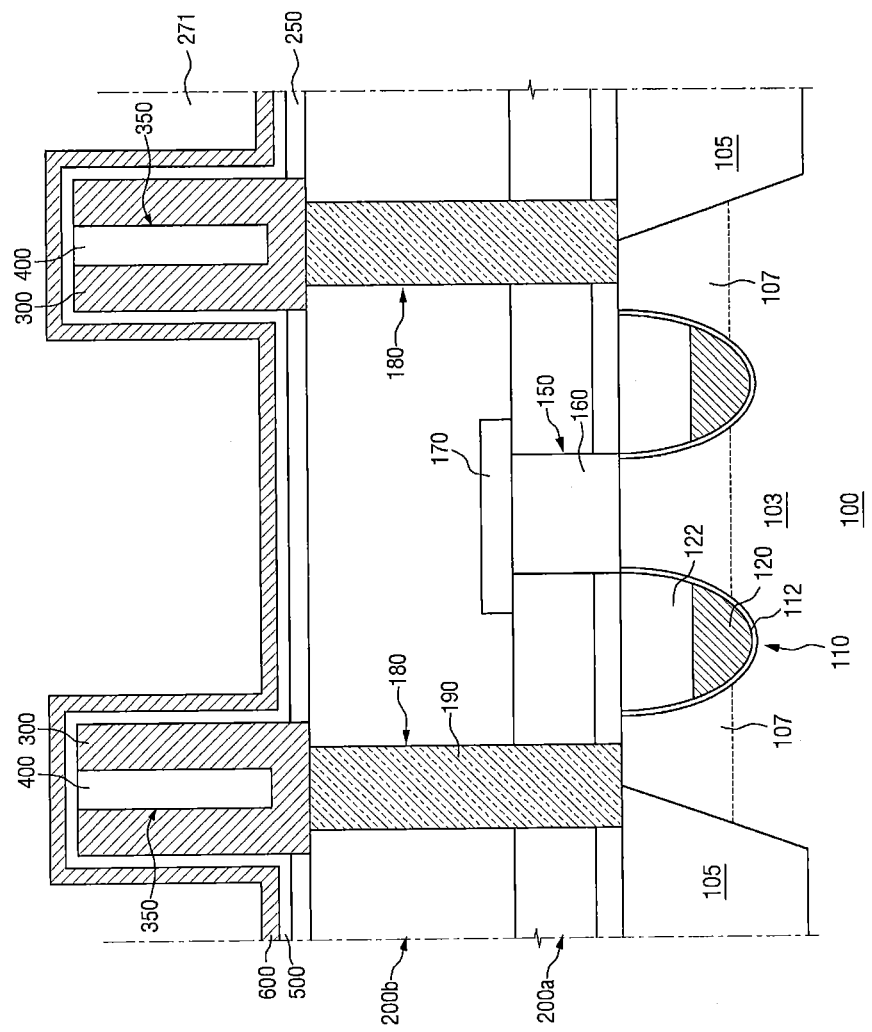
FIG. 2 is a cross-sectional view taken along line A-A' of FIG. 1.
Figure 3:
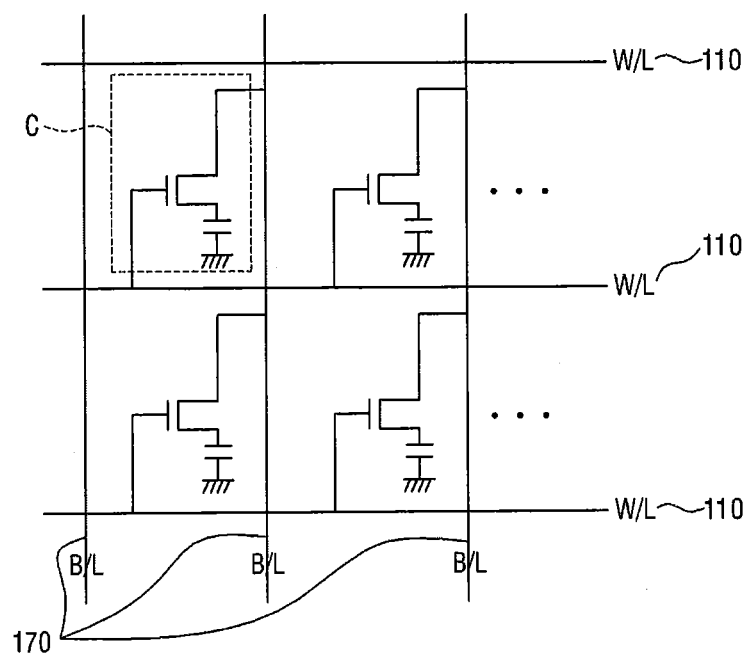
FIG. 3 is a circuit diagram of the semiconductor device of FIG. 1.

Referring to FIGS. 1 through 3, a semiconductor device according to some example embodiments of the inventive concepts includes a substrate 100, trenches 110, gate insulating layers 112, gate electrodes 120, capping patterns 122, source/drain regions 107, contact holes 150, bit line contacts 160, bit lines 170, a first interlayer insulating layer 200a, a second interlayer insulating layer 200b, metal contact plugs 190, lower electrodes 300, upper trenches 350, supporters 400, a dielectric layer 500, and an upper electrode 600.

The substrate 100 may be divided into isolation layers 105 and active regions 103. The active regions 103 are defined by forming isolation regions using the isolation layers 105 of the substrate 100. More specifically, referring to FIG. 1, the active regions 103 are formed to extend in a first direction DR1, gate electrode lines (i.e., word lines) 111 are formed to extend in a second direction Y1 that forms an acute angle with the first direction DR1, and the bit lines 170 are formed to extend in a first direction X1 that forms an acute angle with the first direction DR1. The lower electrodes 300, which are cylindrical, may be formed on both ends of each of the active regions 103.

The term "an angle formed by two directions", as used herein, may denote whichever of two angles formed by the two directions is smaller. For example, if the two angles are 120° and 60°, the particular angle may indicate the angle of 60°. Accordingly, as illustrated in FIG. 1, an angle formed by the first direction DR1 and the second direction Y1 may be θ1, and an angle formed by the first direction DR1 and the first direction X1 may be θ2.

The angles θ1 and θ2 may be set to be acute angles in order to secure a sufficient distance between the bit line contacts 160, which connect the active regions 103 and the bit lines 170, and contact plugs, which connect the active regions 103 and a memory device. The angles θ1 and θ2 may be, for example, 45° and 45°, respectively, 30° and 60°, respectively, or 60° and 30°, respectively, but the inventive concepts are not limited thereto.

Referring again to FIG. 1, the top surfaces of the bit line contacts 160 may be rectangular. That is, in the example embodiment of FIGS. 1 through 3, the bit line contacts 160 may be disposed in rectangular contact holes, and may thus have rectangular top surfaces. The formation of rectangular contact holes will be described later in detail.

Referring again to FIG. 2, the trenches 110 may be formed in the active regions 130, and the gate insulating layers 112, the gate electrodes 120, and the capping patterns 122 may be sequentially formed in the trenches 110, respectively. The source/drain regions 107 may be formed on both sides of each of the trenches 110. The trenches 110 may be buried trenches, but the inventive concepts are not limited thereto. The gate electrodes 120 and their respective pairs of source/drain regions 107 may serve as buried channel array transistors (BCATs).

The first interlayer insulating layer 200a may be formed on the BCATs, and the bit line contacts 160, which are connected to the bit lines 170, may be formed to penetrate the first interlayer insulating layer 200a. The second interlayer insulating layer 200b may be formed on, and in some embodiments to cover, the bit lines 170, and the first and second interlayer insulating layers 200a and 200b may be formed using a silicon oxide such as BoroSilicate Glass (BSG), PhosphoSilicate Glass (PSG), BoroPhosphoSilicate Glass (BPSG), Undoped Silicate Glass (USG), TetraEthyl- OrthoSilicate (TEOS) glass, and/or High Density Plasma (HDP)-Chemical Vapor Deposition (CVD).

The metal contact plugs 190 may be formed to penetrate the first and second interlayer insulating layers 200a and 200b. The metal contact plugs 190 may electrically connect the elements between the first and second interlayer insulating layers 200a and 200b. The metal contact plugs 190 may contain, for example, tungsten (W), but the inventive concepts are not limited thereto.

An etch stop layer 250 may be disposed on the first and second interlayer insulating layers 200a and 200b and on the sides of the lower electrodes 300. The etch stop layer 250 may be formed of a material having a low etch rate and may serve as an end point layer for an etching process. In the example embodiment of FIGS. 1 through 3, the etch stop layer 250 may contain, for example, SiON and/or SiN. The etch stop layer 250 may not be provided in other embodiments.

The lower electrodes 300 may be formed on the metal contact plugs 190. The lower electrodes 300 may be cylindrical. The lower electrodes 300 may serve as capacitors along with the upper electrode 600 and the dielectric layer 500. The lower electrodes 300 may be formed of a conductive material. For example, the conductive material may be TiN, TaN, W, ruthenium (Ru), and/or platinum (Pt), but the inventive concepts are not limited thereto.

The lower electrodes 300 may be in the shape of elongated stacks. An array of a plurality of lower electrodes 300 may be formed. The supporters 400 may be respectively formed in the lower electrodes 300. The dielectric layer 500 and the upper electrode 600 may be formed on the lower electrodes 300 and the supporters 400. The lower electrodes 300 may be formed at both ends of each of the active regions 103.

The upper trenches 350 may be formed in the lower electrodes 300. More specifically, due to the presence of the upper trenches 350, the lower electrodes 300 may become cylindrical. The upper trenches 350 may be formed in the lower electrodes 300 to save the conductive material used to form the lower electrodes 300. However, the presence of the upper trenches 350 may structurally weaken the lower electrodes 300, and thus, the supporters 400 may be provided to reinforce the lower electrodes 300.

The supporters 400 may be formed in the upper trenches 350. More specifically, the supporters 400 may completely fill the upper trenches 350. The top surfaces of the supporters 400 may be on the same plane as the top surfaces of the lower electrodes 300. The expression "on the same plane", as used herein, may encompass an example in which there is a slight height difference between the top surfaces of the supporters 400 and the top surfaces of the lower electrodes 300.

The dielectric layer 500 may be on, and in some embodiments may cover, the lower electrodes 300, the supporters 400, and the etch stop layer 250. The dielectric layer 500 may reduce, and in some embodiments may block, the transmission of charges between the lower electrodes 300 and the upper electrode 600. The dielectric layer 500 does not transmit charges therethrough, but may allow the lower electrodes 300 and the upper electrode 600 to be electrified because of a voltage difference between the lower electrodes 300 and the upper electrode 600. The dielectric layer 500 may be formed of $Al_2O_3$, $HfO_2$, a lanthanum-based oxide, $ZrO_2$, $Ta_2O_5$, $TiO_2$, $SrTiO_3$, $BaSrTiO_3$, and/or a combination thereof, but the inventive concepts are not limited thereto.

The upper electrode 600 may be formed on the dielectric layer 500. The upper electrode 600 may form capacitors together with the dielectric layer 500 and the lower electrodes 300. That is, the upper electrode 600 may collect charges together with the lower electrodes 300. The upper electrode 600 may be formed of almost the same material as the lower electrodes 300. For example, the upper electrode 600 may contain TiN, TaN, W, Ru and/or Pt, but the inventive concepts are not limited thereto.

Referring again to FIG. 3, the semiconductor device may be represented by a circuit diagram in which the word lines 110 and the bit lines 170 form a lattice structure. The semiconductor device may be a dynamic random access memory (DRAM) device in which a transistor and a capacitor are provided in each cell of the grid structure formed by the word lines 110 and the bit lines 170.

More specifically, the gate insulating layers 112, the gate electrodes 120, and the capping patterns 122, which are all formed in the trenches 110, may serve together as the gate of a transistor of a cell C of FIG. 3. Since two gates are illustrated in FIG. 2, it is apparent that FIG. 2 is a cross-sectional view of two cells of the semiconductor device. First and second source/drain regions 1500a and 1500b, which are formed on both sides of each of the trenches 110, may serve as the source and the drain of the transistor of the cell C. The lower electrodes 300, the dielectric layer 500, and the upper electrode 600 may serve together as a capacitor of the cell C.

A manufacturing method of a semiconductor device, according to some example embodiments of the inventive concepts, will hereinafter be described with reference to FIGS. 4 through 38.

A method of forming a contact hole will also be described along with the manufacturing method. That is, the manufacturing method includes the method of forming a contact hole. However, the method of forming a contact hole and the manufacturing method may be independent of each other. That is, the method of forming a contact hole is not limited to being used in the manufacturing method, but may be used to form various holes for various purposes.

FIGS. 4 through 38 are schematic views illustrating intermediate steps of a manufacturing method of a semiconductor device, according to example embodiments of the inventive concepts.

Figure 13:
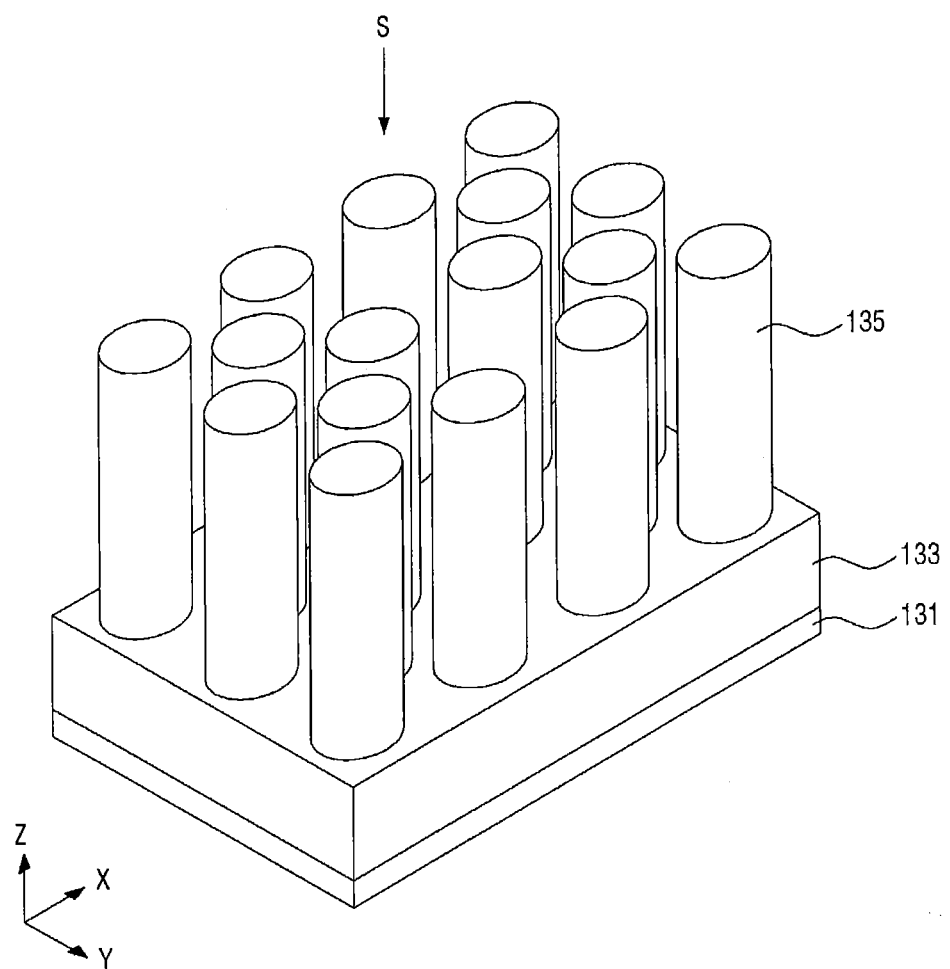
Figure 14:
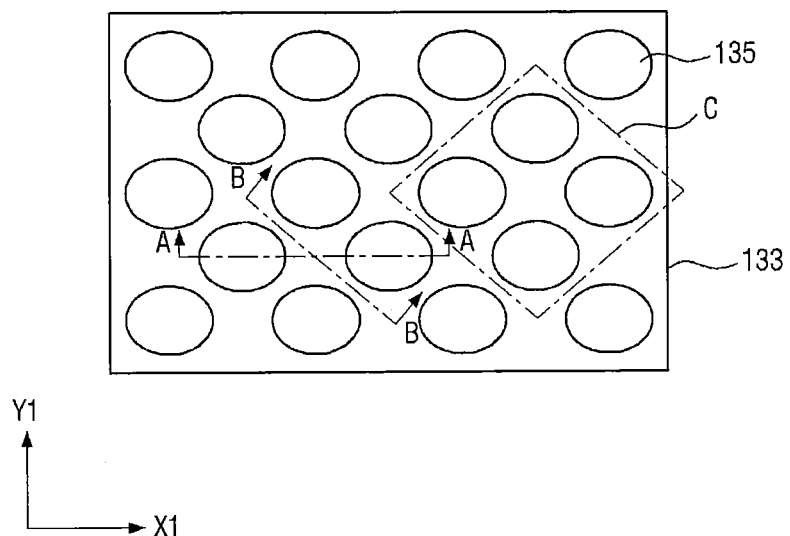
Figure 17:
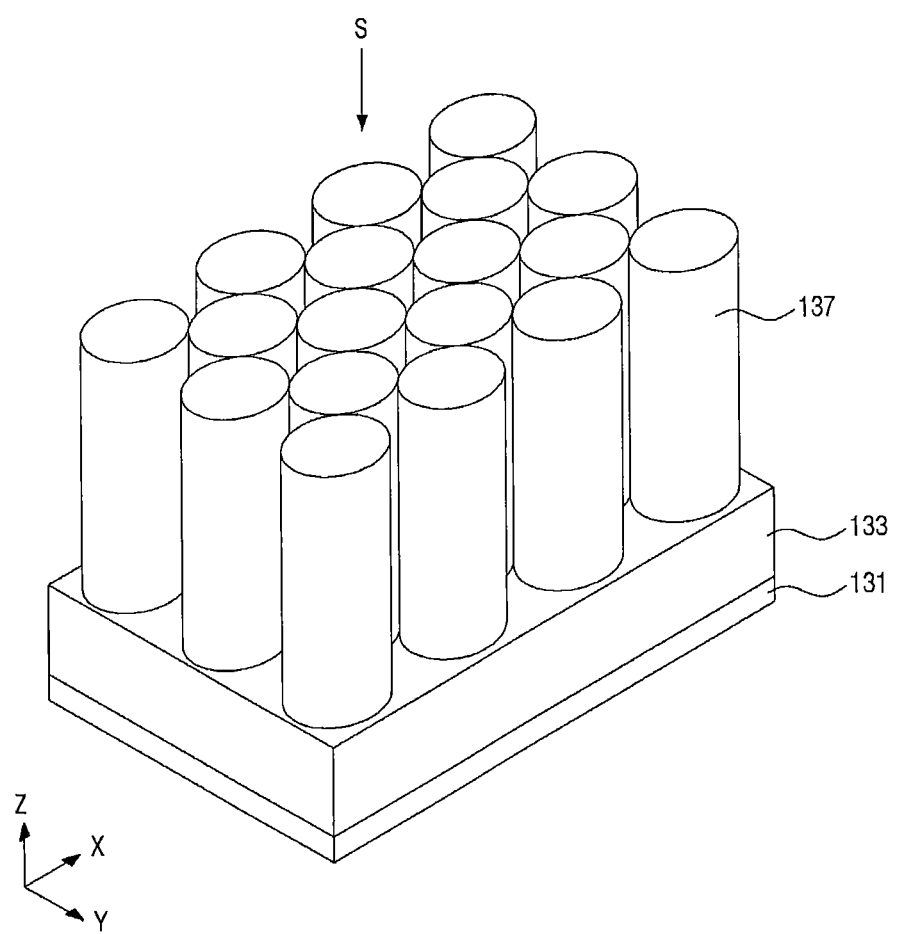
Figure 18:
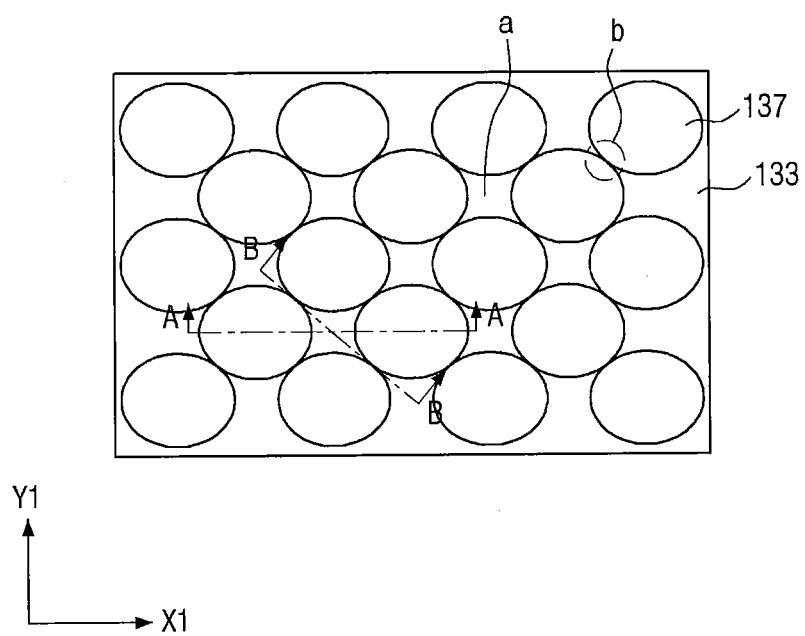
Figure 20:
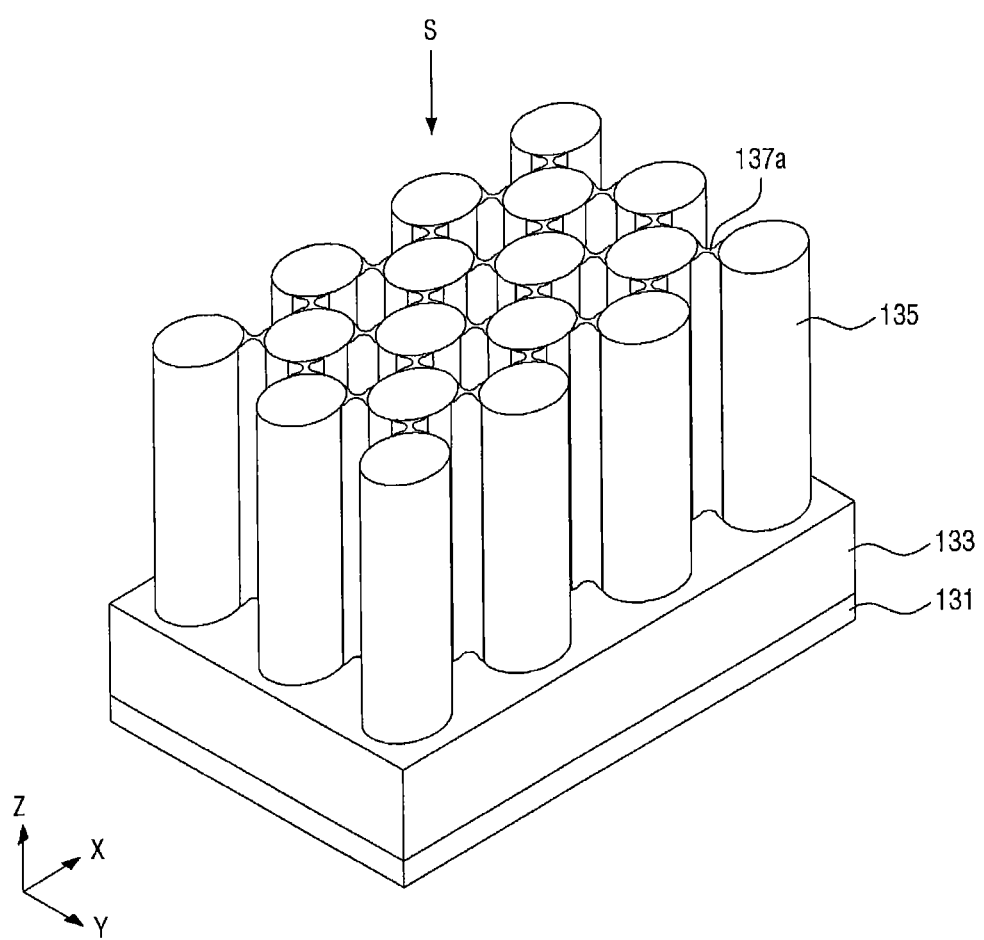
Figure 21:
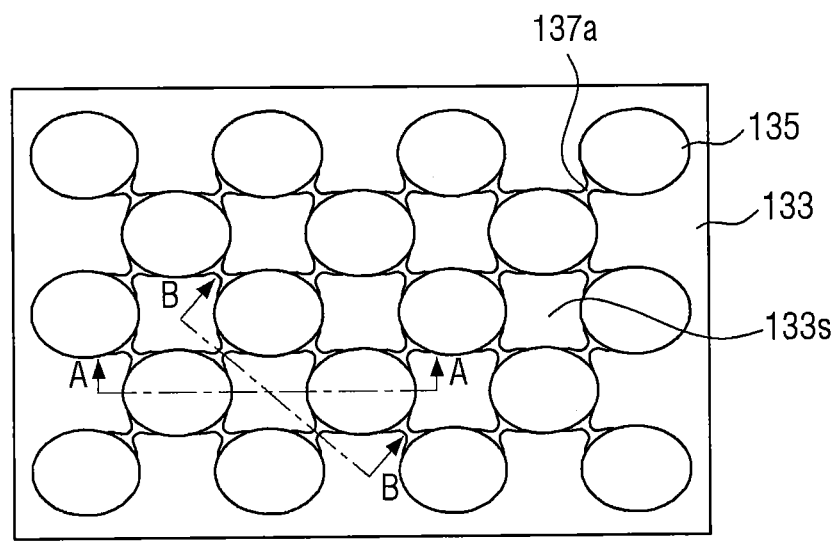
Figure 23:
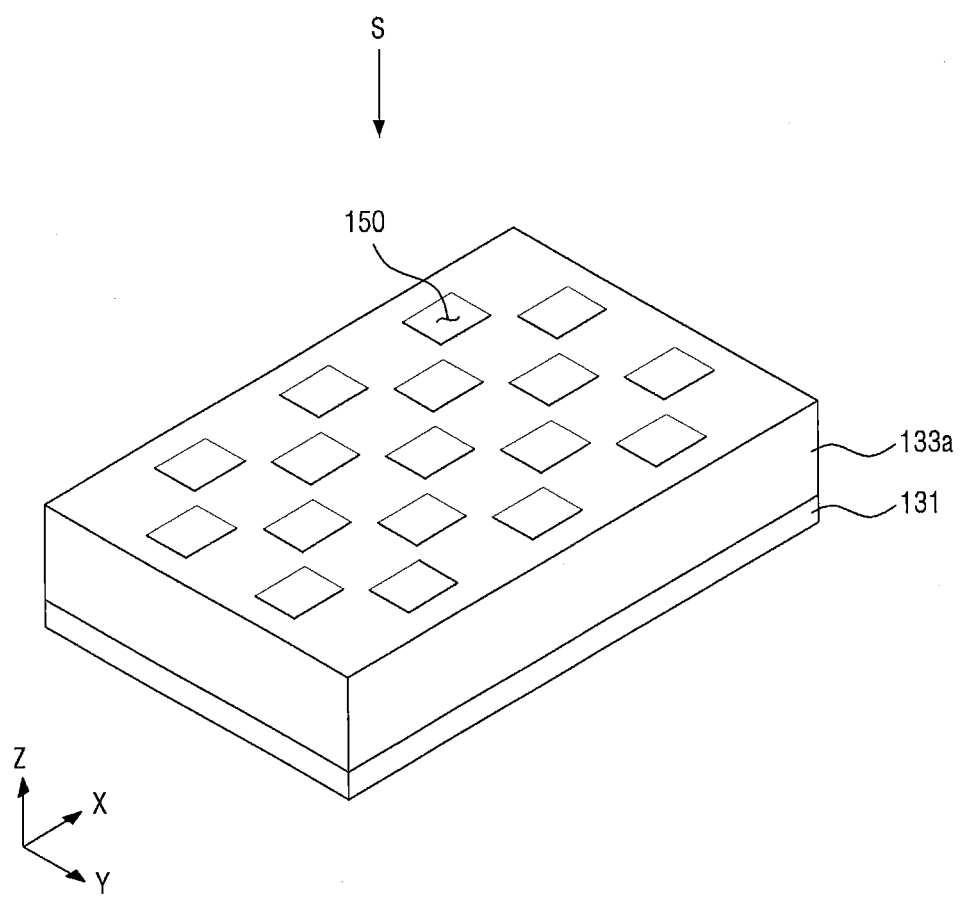
Figure 24:
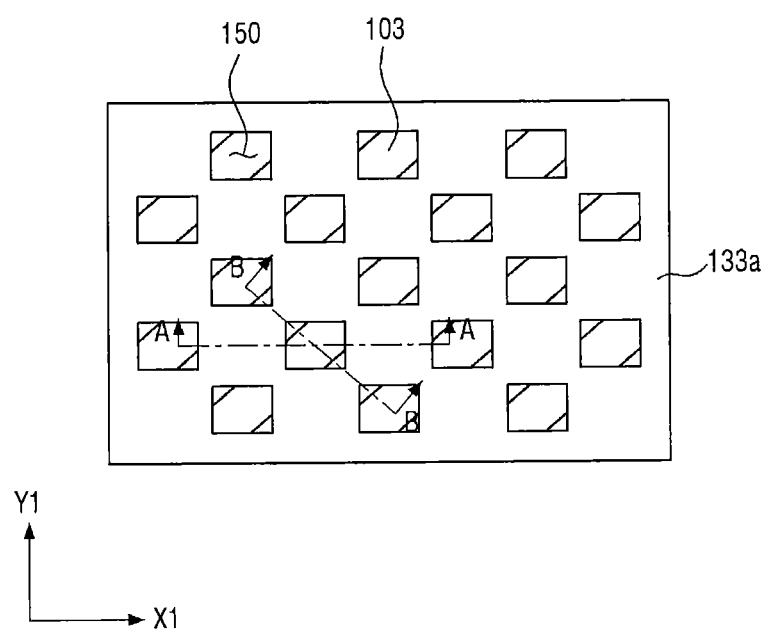

More specifically, FIG. 13 is a perspective view illustrating an intermediate step of a manufacturing method of a semiconductor device, according to an example embodiment of the inventive concepts, and FIG. 14 is a perspective view of FIG. 13 as seen from a direction S. FIG. 15(a) is a cross-sectional view taken along line A-A of FIG. 14, and FIG. 15(b) is a cross-sectional view taken along line B-B of FIG. 14. FIG. 17 is a perspective view illustrating an intermediate step of the manufacturing method, and FIG. 18 is a perspective view of FIG. 17 as seen from the direction S. FIG. 19(a) is a cross-sectional view taken along line A-A of FIG. 18, and FIG. 19(b) is a cross-sectional view taken along line B-B of FIG. 18. FIG. 20 is a perspective view illustrating an intermediate step of the manufacturing method, and FIG. 21 is a perspective view of FIG. 20 as seen from the direction S. FIG. 22(a) is a cross-sectional view taken along line A-A of FIG. 21, and FIG. 22(b) is a cross-sectional view taken along line B-B of FIG. 21. FIG. 23 is a perspective view illustrating an intermediate step of the manufacturing method, and FIG. 24 is a perspective view of FIG. 23 as seen from the direction S. FIG. 25(a) is a cross-sectional view taken along line A-A of FIG. 24, and FIG. 25(b) is a cross-sectional view taken along line B-B of FIG. 24.

Figure 4:
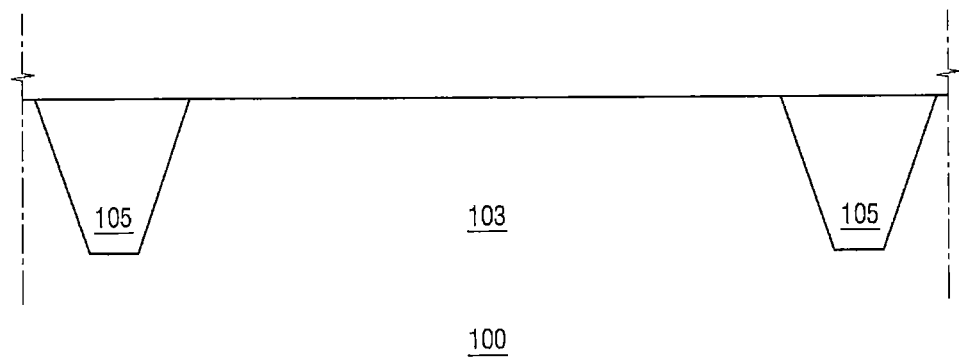
FIGS. 4 through 38 illustrate intermediate steps of a manufacturing method of a semiconductor device, according to example embodiments of the inventive concepts.
Figure 5:
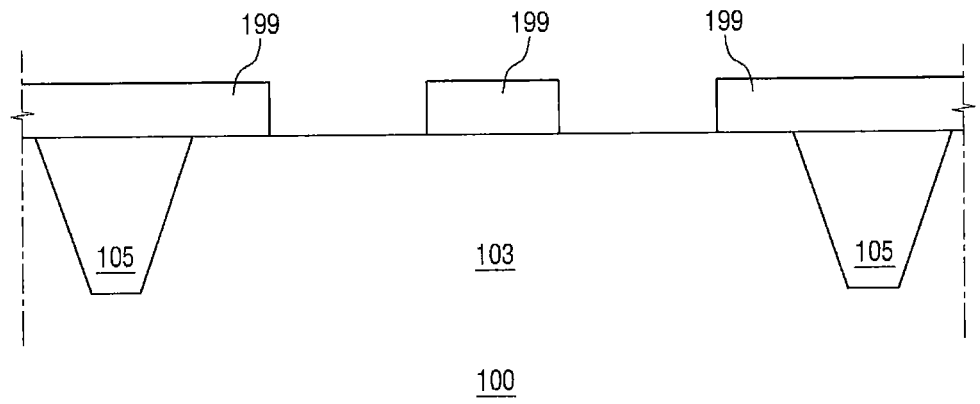

FIG. 4 is a cross-sectional view of a substrate 100, taken along line A-A of FIG. 1. That is, the example embodiment of FIGS. 4 through 38 may provide, but is not limited to, a manufacturing method of the semiconductor device according to the example embodiment of FIGS. 1 through 3. Thus, any repetitive descriptions of the same or like elements will hereinafter be omitted.

Referring to FIG. 4, isolation layers 105 are formed on a substrate 100.

The substrate 100 may have a structure in which a base substrate and an epitaxial layer are stacked, but the inventive concepts are not limited thereto. The substrate 100 may be a silicon substrate, a gallium arsenide substrate, a silicon germanium substrate, a ceramic substrate, a quartz substrate and/or a glass substrate for a display, and/or may be a Semiconductor-On-Insulator (SOI) substrate. In the description that follows, it is assumed that the substrate 100 is a silicon substrate.

By forming the isolation layers 105, active regions 103 may be defined on the substrate 100. The active regions 103 may be defined by the isolation layers 105, such as Shallow Trench Isolations (STIs).

The active regions 103 may correspond to the active regions 103 of FIG. 1. Accordingly, as illustrated in FIG. 1, a plurality of isolation regions 103 may be formed on the substrate 100 to be spaced from one another.

Thereafter, mask patterns 199 are formed on the substrate 100.

The mask patterns 199 expose regions in which to form trenches 110. The mask patterns 199 may be formed using an oxide layer, a nitride layer, or an oxynitride layer, but the inventive concepts are not limited thereto.

Figure 6:
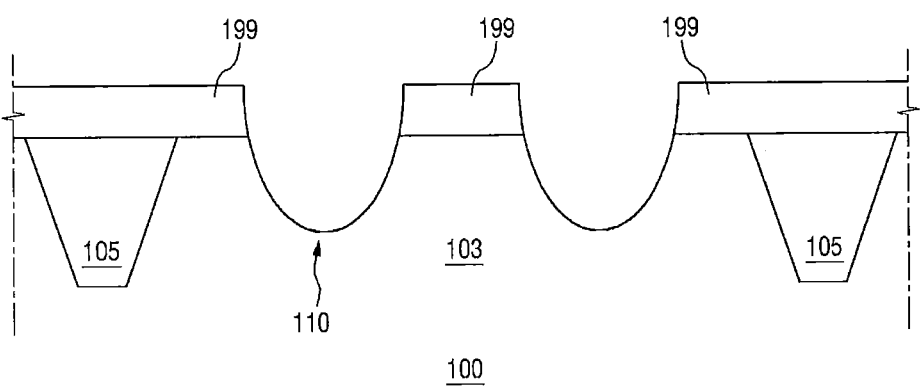

Referring to FIG. 6, the trenches 110 are formed in regions where the mask patterns 199 are not formed. Trenches (not illustrated) may be additionally formed in the isolation layers 105. The trenches 110 may be formed in various shapes. For example, the trenches 110 may be formed to have sides inclined at a predetermined angle with respect to the bottom surfaces of the trenches 110, as illustrated in FIG. 6. The trenches 110 may be formed to have rounded bottom edges.

Figure 7:
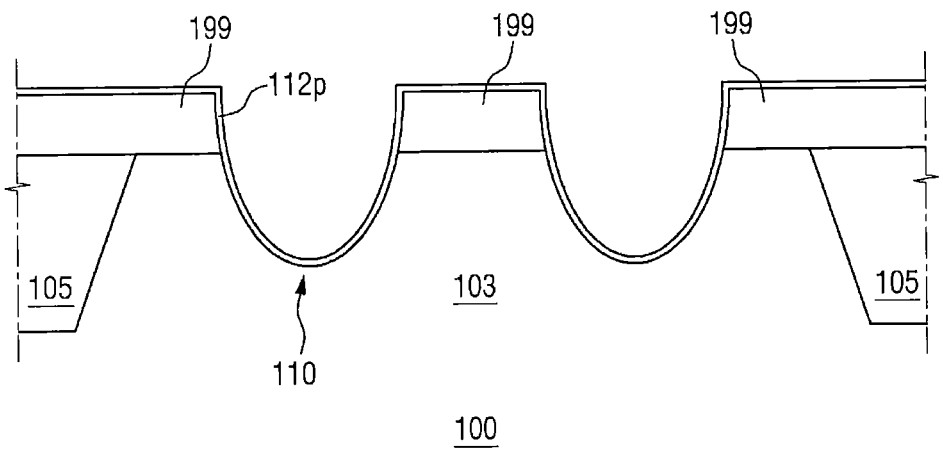

Referring to FIG. 7, an insulating layer 112p is formed on the top surfaces of the trenches 110 and the top surfaces of the mask patterns 199.

The insulating layer 112p is conformally formed in the trenches 110 and on the mask patterns 199. The insulating layer 112p may contain, for example, silicon oxide, silicon nitride and/or silicon oxynitride and/or may contain, for example, a high dielectric constant material. The high dielectric constant material may include for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate, but the inventive concepts are not limited thereto.

Figure 8:
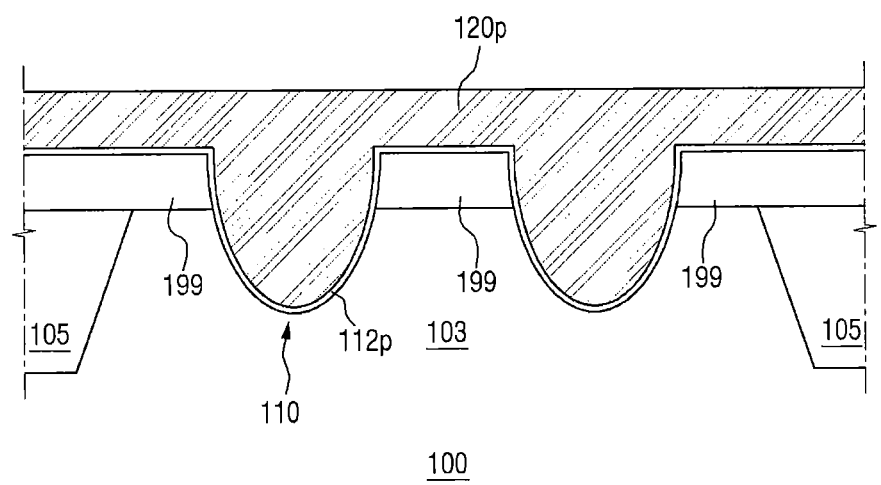

Referring to FIG. 8, an electrode material 120p is formed to cover the insulating layer 112p.

The electrode material 120p may be formed using a conductive material such as, for example, a metal or polysilicon, but the inventive concepts are not limited thereto.

Figure 9:
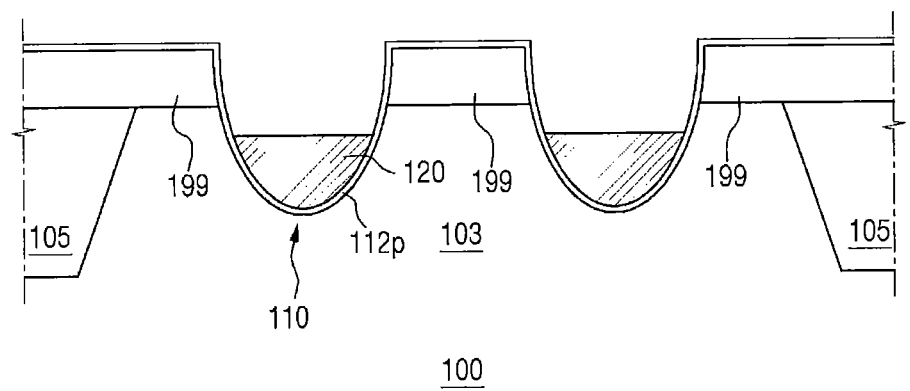

Referring to FIG. 9, by etching the electrode material 120p, gate electrodes 120 are formed to at least partially fill the trenches 110.

That is, the gate electrodes 120 may be in the form of recesses. The top surfaces of the gate electrodes 120 may be lower than the top surface of the substrate 100. The etching of the electrode material 120p may be performed using an etch-back process.

Figure 10:
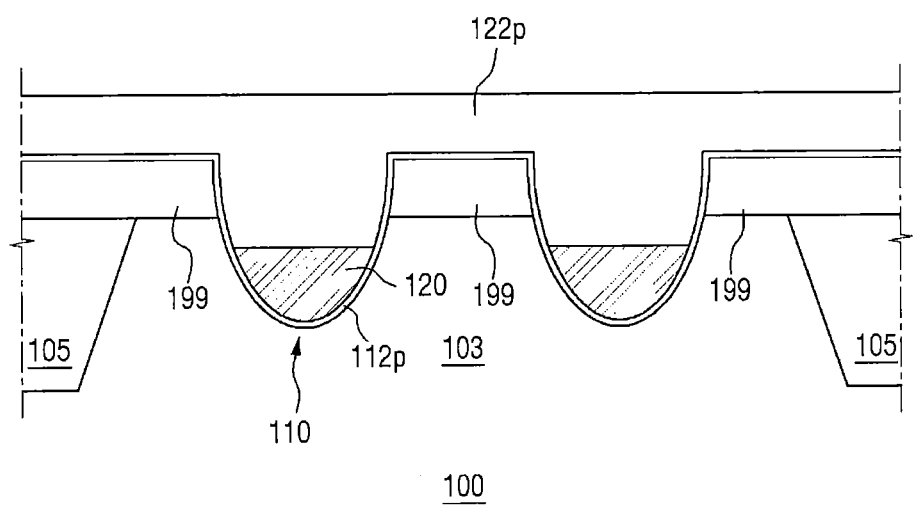

Referring to FIG. 10, a capping material 122p may be formed on the gate electrodes 120 and in some embodiments, to fill the trenches 110.

The capping material 122p may be, for example, an oxide layer, a nitride layer, and/or an oxynitride layer, but the inventive concepts are not limited thereto.

Figure 11:
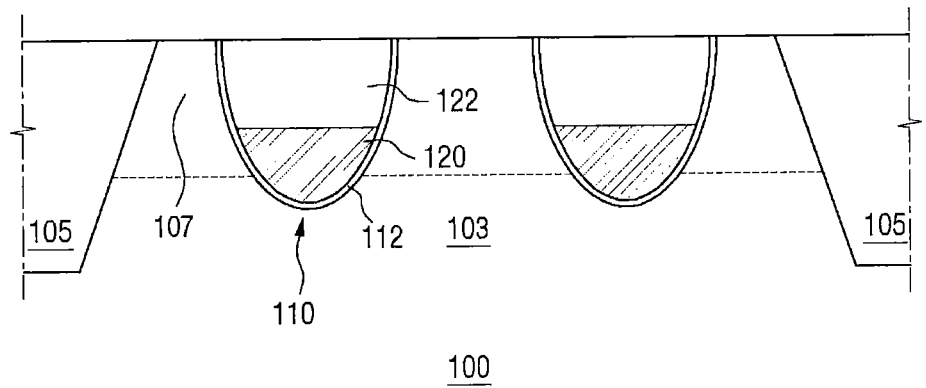

Referring to FIG. 11, the capping material 122p, the insulating layer 112p, and the mask patterns 199 may be etched to expose the top surface of the substrate 100.

The etching of the capping material 122p, the insulating layer 112p, and the mask patterns 199 may be performed using, for example, Chemical Mechanical Polishing (CMP). As a result, the capping material 122p may be etched into capping patterns 122, and the insulating layer 112p may be etched into gate insulating layers 112. A gate insulating layer 112 may be formed only in the trenches 110. The mask patterns 199 may all be removed. That is, the top surfaces of the capping patterns 122p, the gate insulating layers 112, the active regions 103, and the isolation layers 105 may be in the same plane, but the inventive concepts are not limited thereto.

Thereafter, source/drain regions 107 are formed in the active regions 103. The source/drain regions 107 may be formed on both sides of each of the trenches 110.

Figure 12:
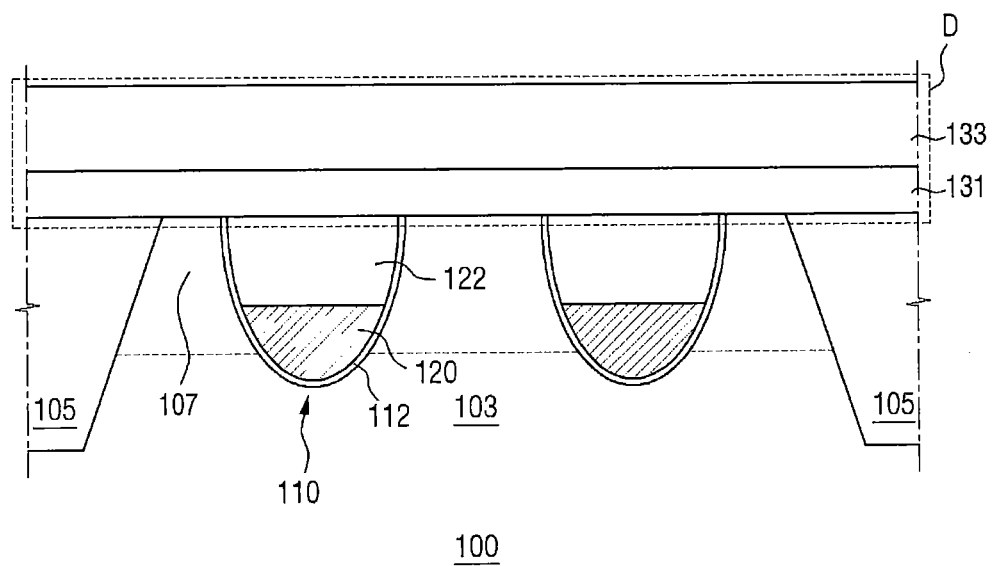

Referring to FIG. 12, a buffer layer 131 and an insulating layer 133 are formed on the active regions 103 and the isolation layers 105.

More specifically, the buffer layer 131 may be formed on the active regions 103 and the isolation layers 105, and the insulating layer 133 may be formed on the buffer layer 131. Alternatively, the insulating layer 133 may be formed directly on the active regions 103 and the isolation layers 105 without forming the buffer layer 131.

The insulating layer 133 may be formed using silicon oxide, silicon nitride and/or polysilicon. The buffer layer 131 may be disposed between the insulating layer 133 and the active regions 103, and may help the formation of the insulating layer 133 while reducing or preventing damage to the active regions 103.

A method of forming contact holes 150 in an area D of the substrate 100 of FIG. 12 will hereinafter be described with reference to FIGS. 13 through 25, and in FIGS. 13 through 25, the part of the substrate 100 below the area D is omitted from illustration for convenience.

A method of forming a contact hole according to an example embodiment of the inventive concepts will hereinafter be described with reference to FIGS. 12 through 26. The example embodiment of FIGS. 12 through 26 will hereinafter be described, taking an example in which the contact holes 150 are formed in the active regions 103 among the trenches 110, but the inventive concepts are not limited thereto.

Figure 15:
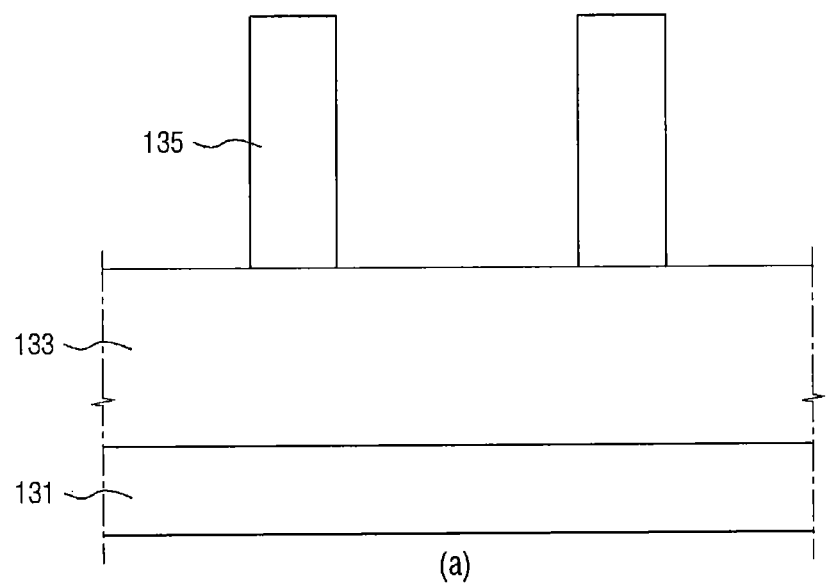
Figure 15:
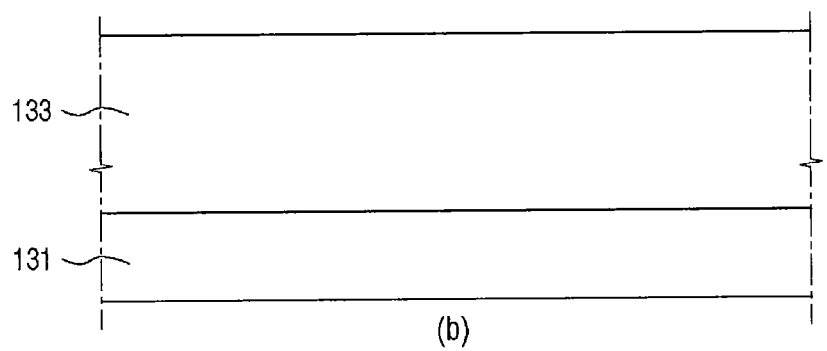

Referring to FIGS. 13 through 15, pillar masks 135 are formed on the insulating layer 133.

More specifically, a plurality of pillar masks 135 may be formed. The pillar masks 135 may be disposed to be spaced from one another. The pillar masks 135 may be formed on the insulating layer 133 as pillars extending in a third direction Z. The pillar masks 135 may be formed using silicon oxide, silicon nitride, polysilicon, and/or a Spin-On-Hardmask (SOH) material.

Figure 16:
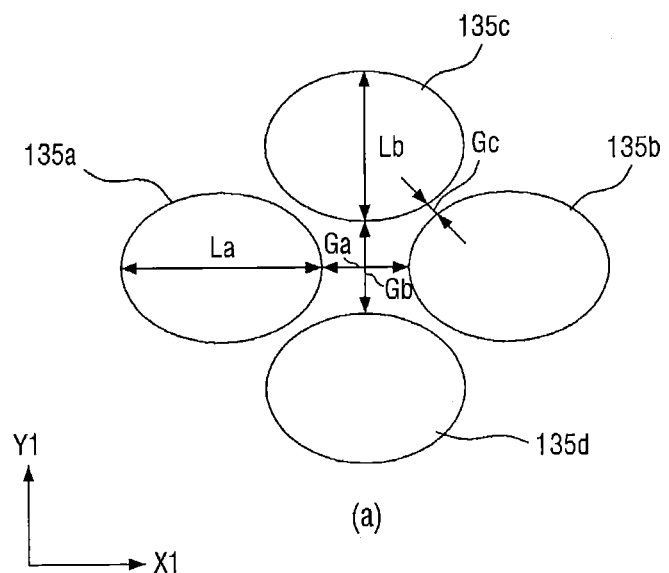
Figure 16:
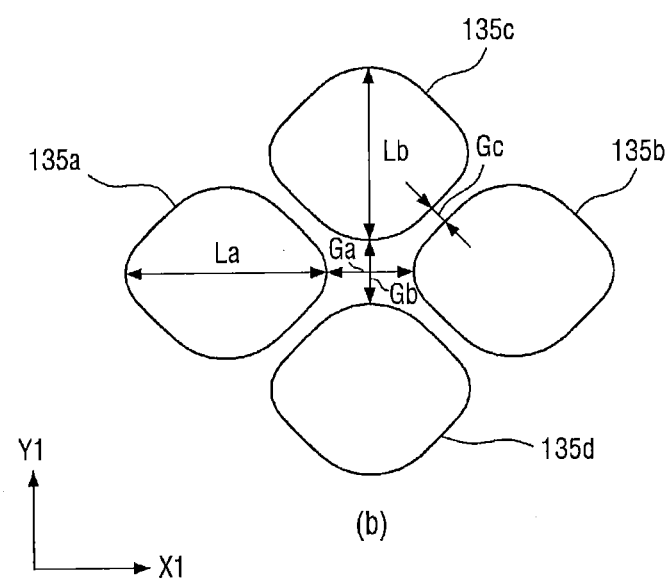
Figure 16:
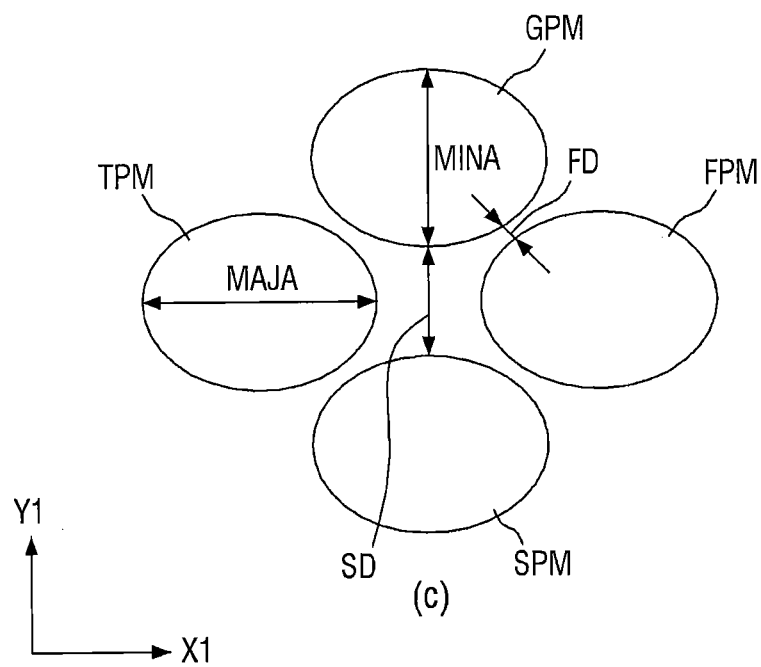
Figure 16:
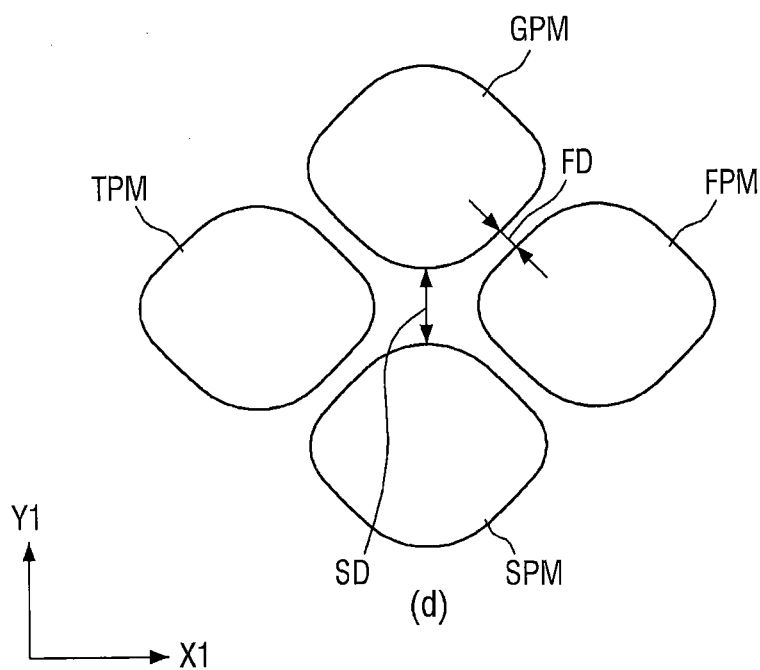

The arrangement of the pillar masks 135 will hereinafter be described with reference to FIGS. 16(a)-16(d) which are collectively referred to as FIG. 16. FIG. 16 is an enlarged perspective view of an area C of FIG. 14. The area C may be a unit area C. In the example embodiment of FIGS. 12 through 26, the unit area C may be an area in which at least one contact hole 150 may be formed.

Referring to FIGS. 16(a)-16(b), in the unit area C, first through fourth pillar masks 135a through 135d may be provided. The first through fourth pillar masks 135a through 135d may be disposed adjacent to one another and may surround an area in the middle thereof. The area in the middle of the first through fourth pillar masks 135a through 135d may be an area which is to be etched to form a contact hole.

FIG. 16(a) illustrates an example in which the first through fourth pillar masks 135a through 135d are elliptical, and FIG. 16(b) illustrates an example in which the first through fourth pillar masks 135a through 135d are rectangular with rounded corners.

As illustrated in FIG. 16, the first and second pillar masks 135a and 135b may be disposed along a first direction X1, and the third and fourth pillar masks 135c and 135d may be disposed along a second direction Y1. The first direction X1 and the second direction Y1 may be perpendicular to each other.

The first and second pillar masks 135a and 135b, which extend along the first direction X1, may be spaced from each other by a first direction gap Ga. The third and fourth pillar masks 135c and 135d, which extend along the second direction Y1, may be spaced from each other by a second direction gap Gb. The first direction gap Ga and the second direction gap Gb may be collectively referred to as a first gap.

The first pillar mask 135a may be spaced from the third and fourth pillar masks 135c and 135c by a second gap Gc. The second pillar mask 135b may be spaced from the third and fourth pillar masks 135c and 135c by the second gap Gc. The third pillar mask 135c may be spaced from the first and second pillar masks 135a and 135b by the second gap Gc. The fourth pillar mask 135d may be spaced from the first and second pillar masks 135a and 135b by the second gap Gc.

The second gap Gc may be smaller than the first and second direction gaps Ga and Gb, i.e., the first gap. The first direction gap Ga may be the same as (as illustrated in FIG. 16(a)), or larger than (as illustrated in FIG. 16(b)), the second direction gap Gb.

More specifically, the first gap may be 2 to 4 times larger than the second gap Gc. In response to the first direction gap Ga being larger than the second direction gap Gb, the first direction gap Ga may be 1.2 to 1.6 times larger than the second gap Gc.

For example, the second gap Gc may be 8 nm to 12 nm, the first direction gap Ga may be 30 nm to 40 nm, and the second direction gap Gb may be 20 nm to 30 nm. However, the inventive concepts are not limited to this example. That is, the first direction gap Ga, the second direction gap Gb, and the second gap Ge may vary depending on the thickness and the type of spacers 137 to be formed on the pillar masks 135.

In the description that follows, it is assumed that the second gap Gc is 10 nm, the first direction gap Ga is 35 nm, and the second direction gap Gb is 25 nm, but the inventive concepts are not limited thereto.

Each of the first through fourth pillar masks 135a through 135d may have a first diameter La in the first direction X1 and a second diameter Lb in the second direction Y1.

That is, in the example in which the first through fourth pillar masks 135a through 135d are elliptical, as illustrated in FIG. 16(a), the long diameter (major axis) of the first through fourth pillar masks 135a through 135d may be referred to as the first diameter La, and the short diameter (minor axis) of the first through fourth pillar masks 135a through 135d may be referred to as the second diameter Lb. In the example in which the first through fourth pillar masks 135a through 135d are rectangular with rounded corners, as illustrated in FIG. 16(b), the diagonal distance, in the first direction X1, of the first through fourth pillar masks 135a through 135d may be referred to as the first diameter La, and the diagonal distance, in the second direction Y1, of the first through fourth pillar masks 135a through 135d may be referred to as the second diameter Lb.

The first diameter La may be the same as, or larger than, the second diameter Lb. The first diameter La may be 1 to 1.3 times larger than the second diameter Lb. The first diameter La may be 70 nm to 80 nm, and the second diameter Lb may be 60 nm to 70 nm. However, the inventive concepts are not limited to this example.

In the description that follows, it is assumed that the first diameter La is 75 nm and the second diameter Lb is 65 nm, but the inventive concepts are not limited thereto.

FIGS. 16(c) and 16(d) are analogous to FIGS. 16(a) and 16(b), but use different terminology. Referring to FIG. 16(c), a plurality of spaced apart pillar masks are also shown. A given pillar mask GPM is spaced apart from a first pillar mask FPM that is adjacent thereto by a first distance FD, and is spaced apart from a second pillar mask SPM that is adjacent thereto by a second distance SD that is greater than the first distance FD. A third pillar mask TPM also is provided. In FIG. 16(c), the given, first and second pillar masks GPM, FPM and SPM respectively, are elliptical pillar masks having major axes MAJA that all extend along a first direction X1, and minor axes MINA that all extend in a second direction Y1 that is different from the first direction X1. As also shown, the first distance FD does not extend along the first direction X1 or the second direction Y1, and the second distance SD extends along the first direction X1 or the second direction Y1. FIG. 16(d) illustrates other embodiments wherein the given, first and second pillar masks GPM, FPM and SPM, respectively, are rectangular pillar masks having sides and corners. The corners may be rounded as shown. A side of the given pillar mask GPM faces a side of the first pillar mask FPM to define the first distance FD, and a corner of the given pillar mask GPM faces a corner of the second pillar mask SPM to define the second distance SD.

Figure 19:
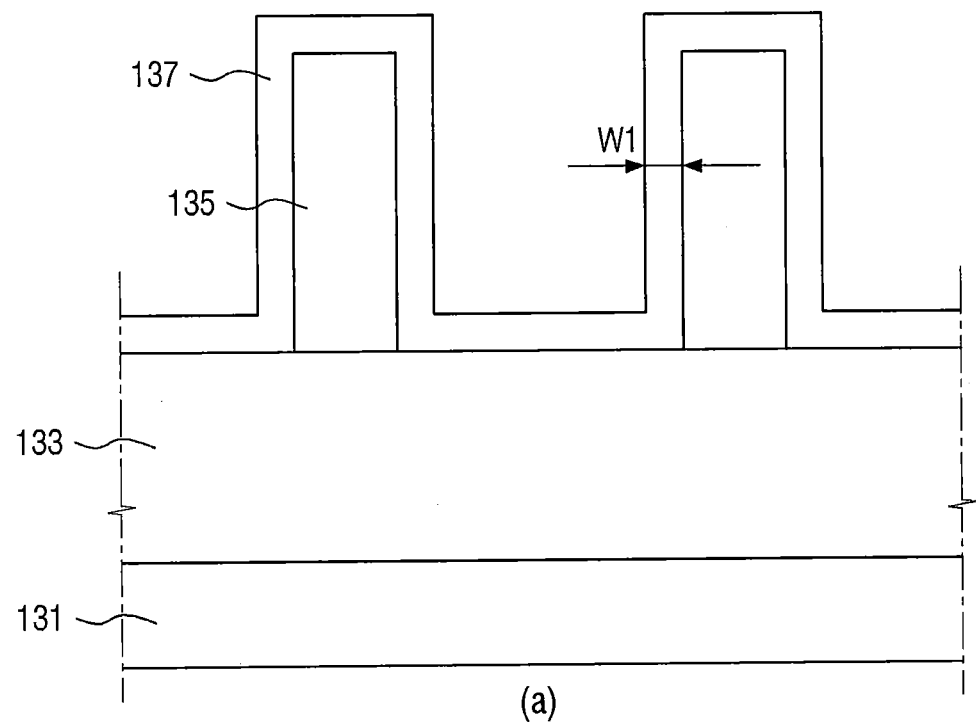
Figure 19:
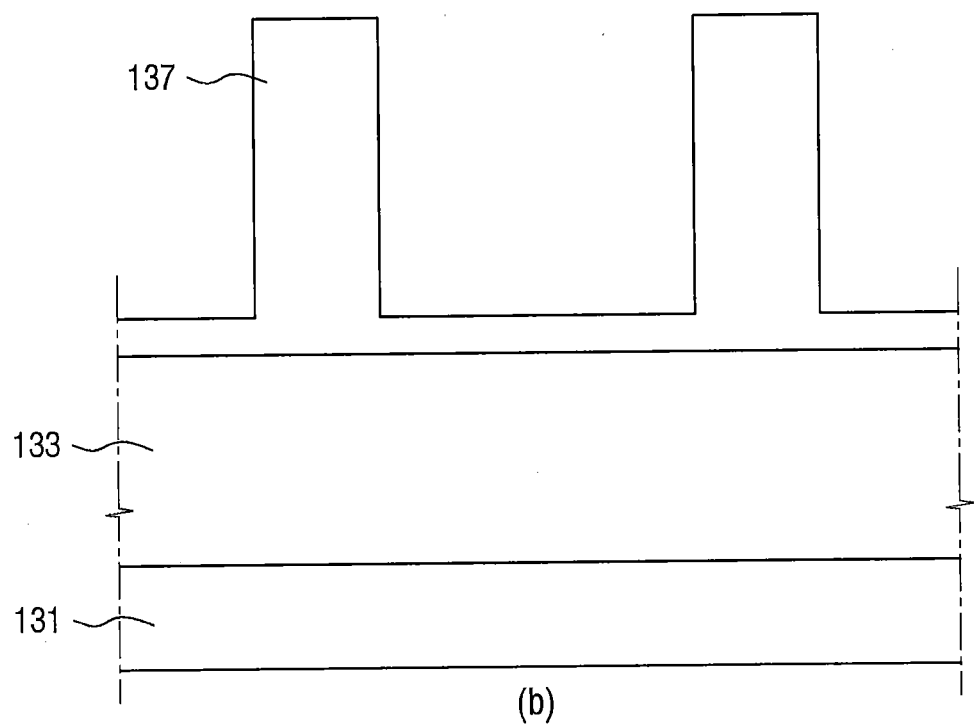

Referring to FIGS. 17 through 19, the spacers 137 are formed on the pillar masks 135.

The spacers 137 may be conformally formed on the pillar masks 135. The spacers 137 may be formed by a deposition process such as Atomic Layer Deposition (ALD). The spacers 136 may be formed using silicon oxide, silicon nitride, polysilicon, and/or a carbon layer, but the inventive concepts are not limited thereto.

Since the spacers 137 are formed on the pillar masks 135, which have the first direction gap Ga, the second direction gap Gb, and the second gap Gc thereamong, the spacers 137 may contact one another in regions where the pillar masks 153 have the second gap Gc thereamong.

That is, referring to areas b of FIG. 18, the spacers 135 may contact one another and may thus be merged. Areas a of FIG. 18 may be etching areas which are to be etched or in which an etchant is to be injected.

Referring again to FIG. 19, the spacers 135 may be formed on the pillar masks 135 to have a first width W1. In order for the spacers 137 to be merged or contact one another in the regions where the pillar masks 153 have the second gap Gc thereamong, the first width W1 may be at least half the length of the second gap Gc. That is, the length of the second gap Gc may be 2 times or less larger than the first width W1, but the inventive concepts are not limited thereto.

The area by which the spacers 137 are merged or contact one another may vary depending on the thickness of the spacers 137 on the pillar masks 135.

Figure 22:
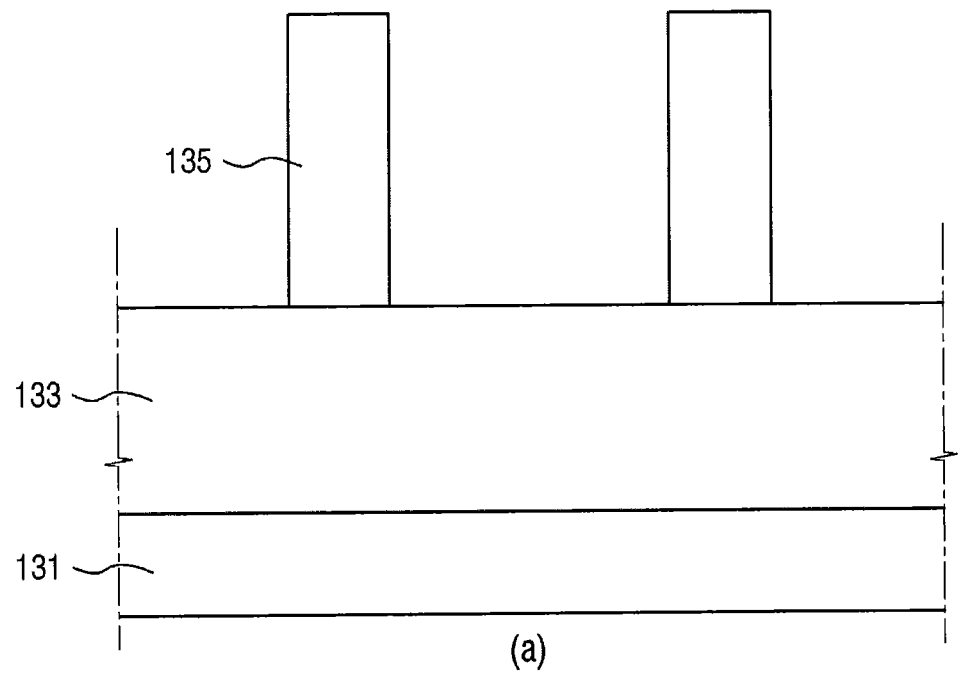
Figure 22:
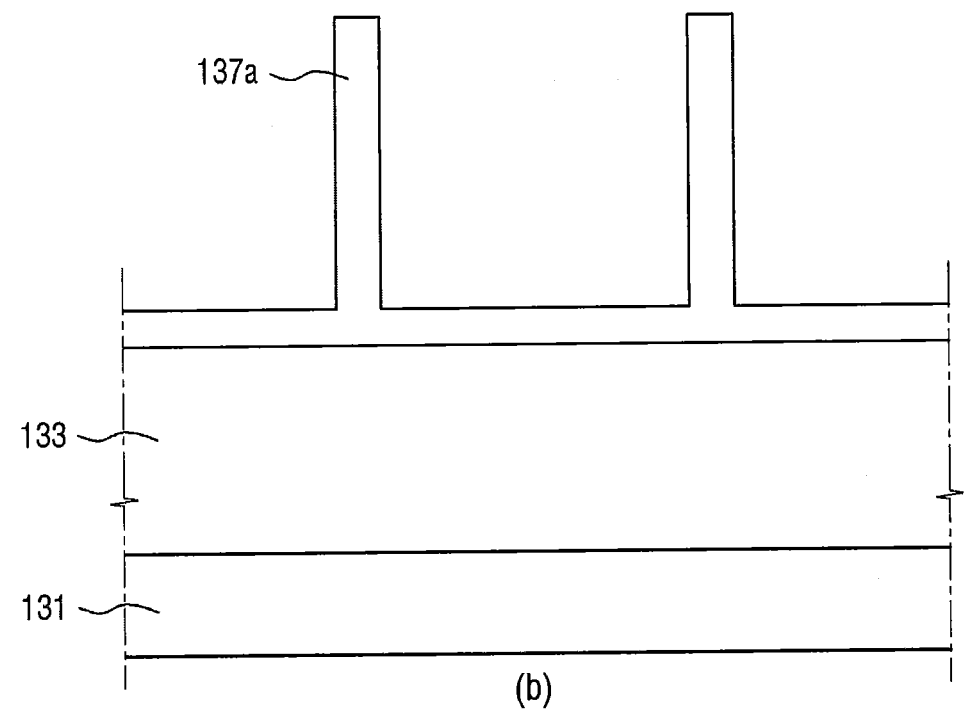

Referring to FIGS. 20 through 22, mask bridges 137a are formed by partially removing the spacers 137.

The mask bridges 137a may be formed because the spacers 137 are partially etched away due to an etchant injected into the etching areas a during a wet etching process, but the inventive concepts are not limited to the wet etching process. That is, various other etching processes such as dry etching may be used to form the mask bridges 137a.

The mask bridges 137a may be formed in the areas b of FIG. 18. That is, the mask bridges 137a may be formed in the regions where the spacers 137 are merged or contact one another.

More specifically, the etchant injected into the etching areas a may etch the spacers 137 over time at a uniform rate. Since the spacers 137 are relatively thickly formed in the regions where the pillar masks 135 have the second gap Gc thereamong, the mask bridges 137a are formed in the regions where the pillar masks 135 have the second gap Gc thereamong, as illustrated in FIG. 20.

The shape and the thickness of the mask bridges 137a may vary depending on the area by which the spacers 137 are merged or contact one another in the regions where the pillar masks 135 have the second gap Gc thereamong.

Referring again to FIG. 21, the etching areas a, which are surrounded by the mask bridges 137a and the pillar masks 135, may be generally rectangular.

Referring again to FIG. 21, with respect to FIGS. 16(c) and 16(d), a mask bridge 137a is formed that bridges the first distance FD so as to connect the given pillar mask GPM to the first pillar mask FPM, but does not bridge the second distance SD so that the given pillar mask GPM is not connected to the second pillar mask SPM by the mask bridge 137a. As was illustrated in FIGS. 18-19, the mask bridge 137a is formed by forming a spacer layer 137 that is at least one half as thick as the first distance FD, conformally on the plurality of spaced apart pillar masks, and partially removing the spacer layer 137 so that the spacer layer 137a remains between the given pillar mask GPM and the first pillar mask FPM but does not remain between the given pillar mask GPM and the second pillar mask SPM.

Figure 25:
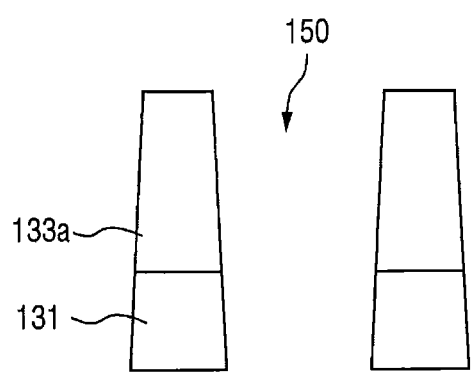
Figure 25:
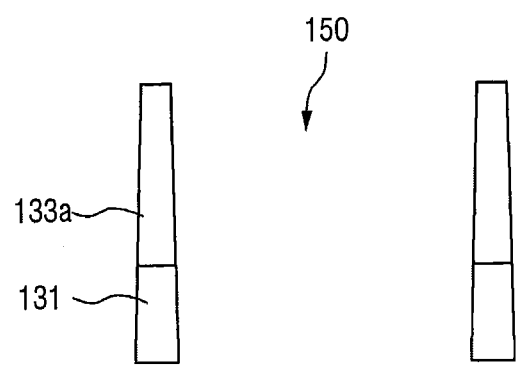

Referring to FIGS. 23 through 25, by patterning the insulating layer 133 using the mask bridges 137a and the pillar masks 135 as a mask, insulating layer patterns 133a, which include the contact holes 150, are formed.

As illustrated in FIG. 24, since the etching areas a of FIG. 23 are generally rectangular, the open tops of the contact hole 150 may be rectangular. The active regions 103, which are disposed below the contact holes 150, may be exposed through the open tops of the contact holes 150.

FIGS. 23 through 25 illustrate an example in which the top surfaces of the insulating layer patterns 133a are exposed, but the mask bridges 137a or the pillar masks 135 may partially remain on the insulating layer patterns 133a.

Since the pillar masks 135 have the first direction gap Ga, the second direction gap Gb, and the second gap Gc thereamong, the spacers 137 may be formed to be merged or contact one another over the pillar masks 135, and as a result, the rectangular etching areas a may be formed. That is, since the mask patterns are rectangular, the contact holes 150, which are obtained from the etching areas a through etching, may be formed to be rectangular. As used herein, "rectangular" means a four-sided figure that may have straight sides and sharp corners, but that may also have somewhat rounded corners and/or sides.

Accordingly, the contact holes 150 may be placed at a sufficient distance from one another, and thus, sufficient contact areas may be secured.

Figure 26:
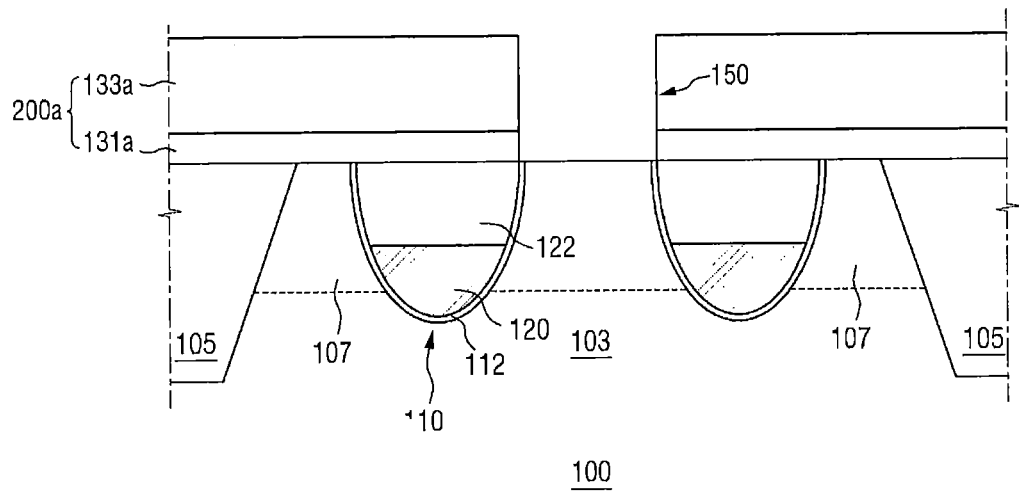

Referring to FIG. 26, the contact holes 150 may be formed in an interlayer insulating layer 200a to expose the active regions 103. The interlayer insulating layer 200a may include the insulating layer patterns 133a and buffer layer patterns 131a.

Figure 27:
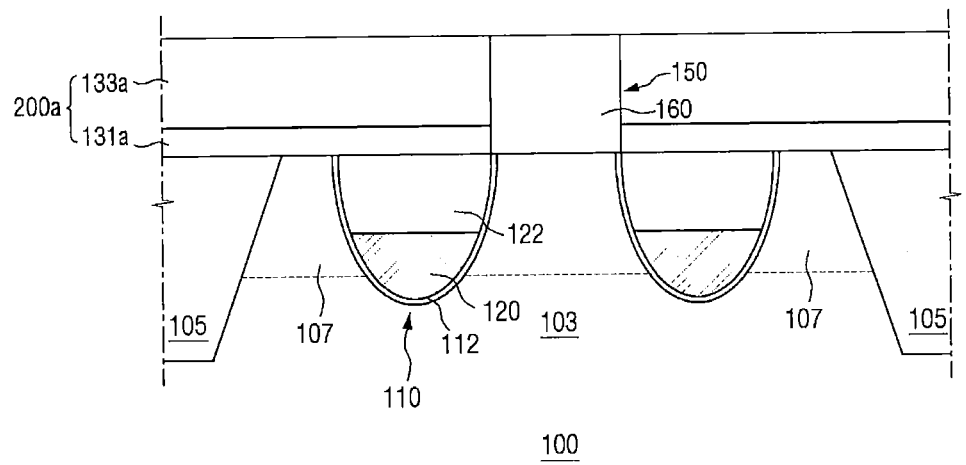

Referring to FIG. 27, bit line contacts 160 may be formed in the contact holes 150. The shape of the bit line contacts 160 may be determined by the shape of the contact holes 150, and thus, the top surfaces of the bit line contacts 160 may be rectangular.

The bit line contacts 160 may contain a conductive material. For example, the bit line contacts 160 may contain polysilicon, a metal silicide compound, conductive metal nitride, and/or a metal, but the inventive concepts are not limited thereto.

Figure 28:
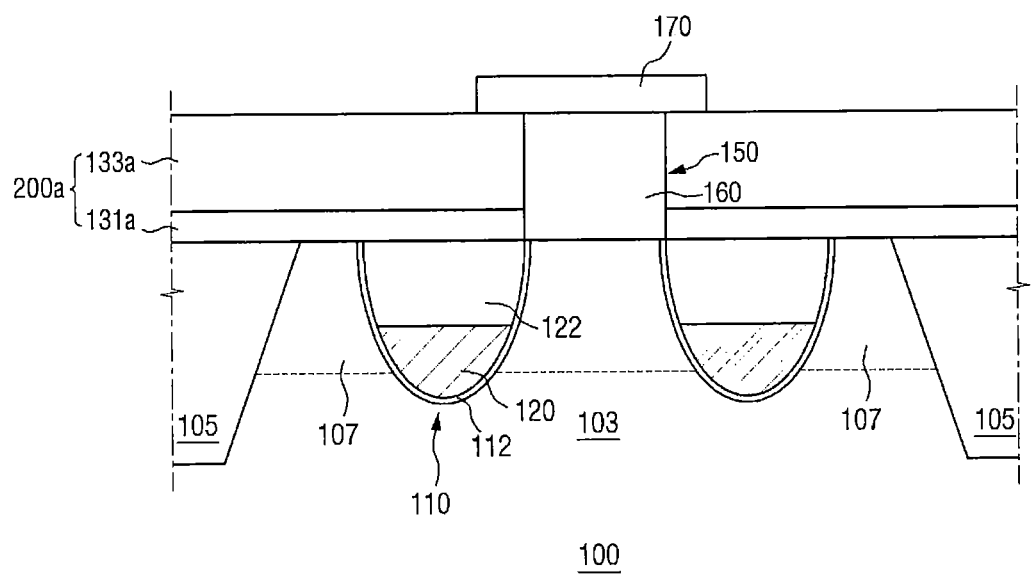

Referring to FIG. 28, bit lines 170, which are electrically connected to the bit line contacts 160, may be formed on the bit line contacts 160.

More specifically, the rectangular top surfaces of the bit line contacts 160 and the bit lines 170 may be placed in contact with each other, and thus, the bit line contacts 160 and the bit lines 170 may be electrically connected to each other.

The bit lines 170 may contain a conductive material. For example, the bit lines 170 may contain polysilicon, a metal silicide compound, conductive metal nitride, and/or a metal, but the inventive concepts are not limited thereto.

Figure 29:
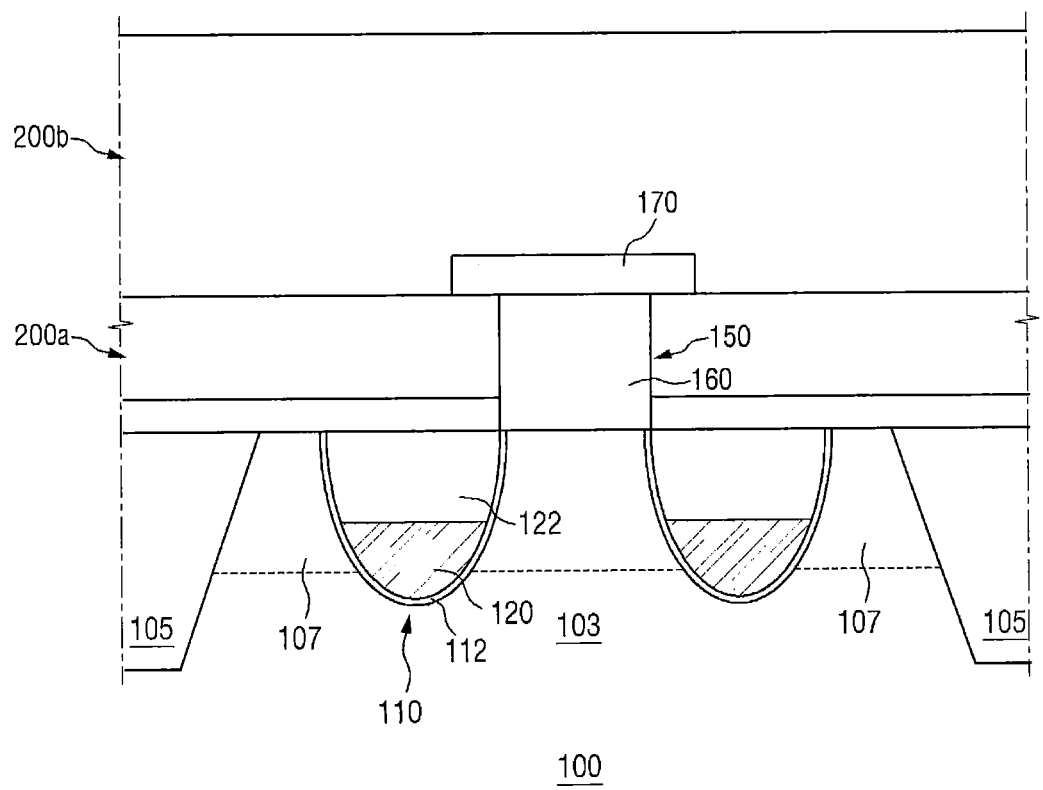

Referring to FIG. 29, a second interlayer insulating layer 200b may be formed on the substrate 100 and may cover the bit lines 170 in some embodiments.

The second interlayer insulating layer 200b may contain, for example, silicon oxide, silicon nitride and/or silicon oxynitride. The second interlayer insulating layer 200b may be a single- or multilayer.

Figure 30:
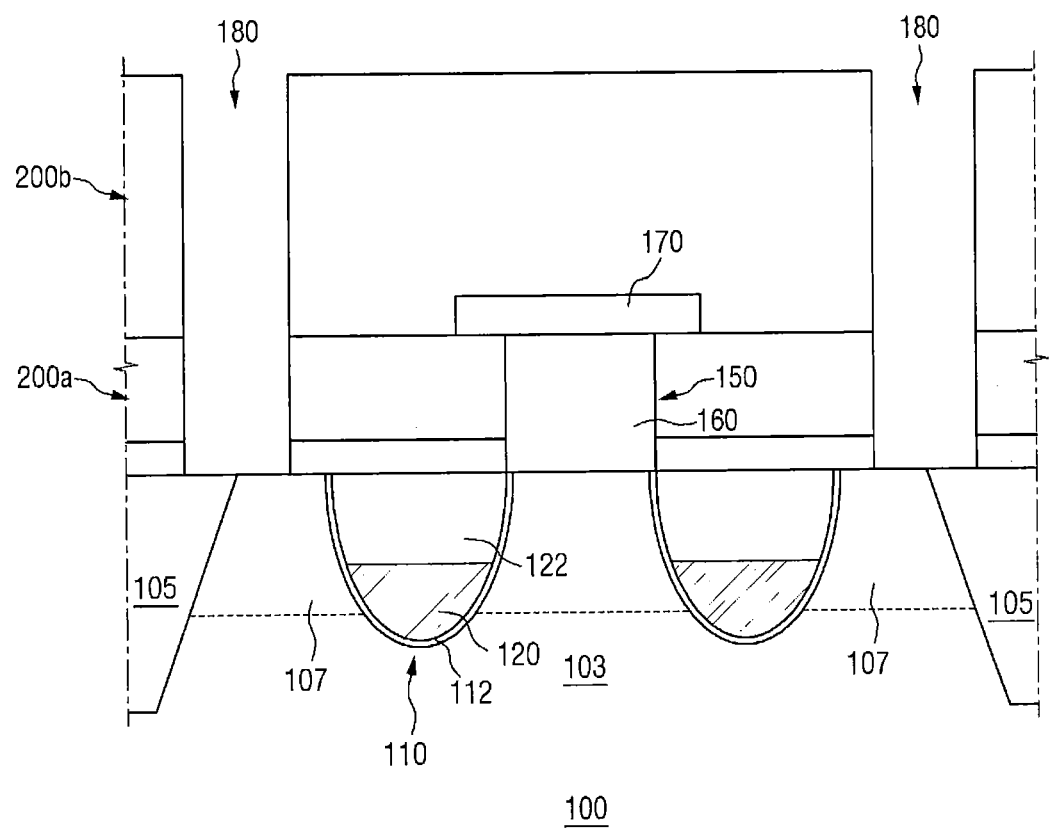

Referring to FIG. 30, contact plug holes 180 may be formed in the first and second interlayer insulating layers 200a and 200b to penetrate the first and second interlayer insulating layers 200a and 200b.

The contact plug holes 180 penetrate the first and second interlayer insulating layers 200a and 200b and expose the active regions 103.

Figure 31:
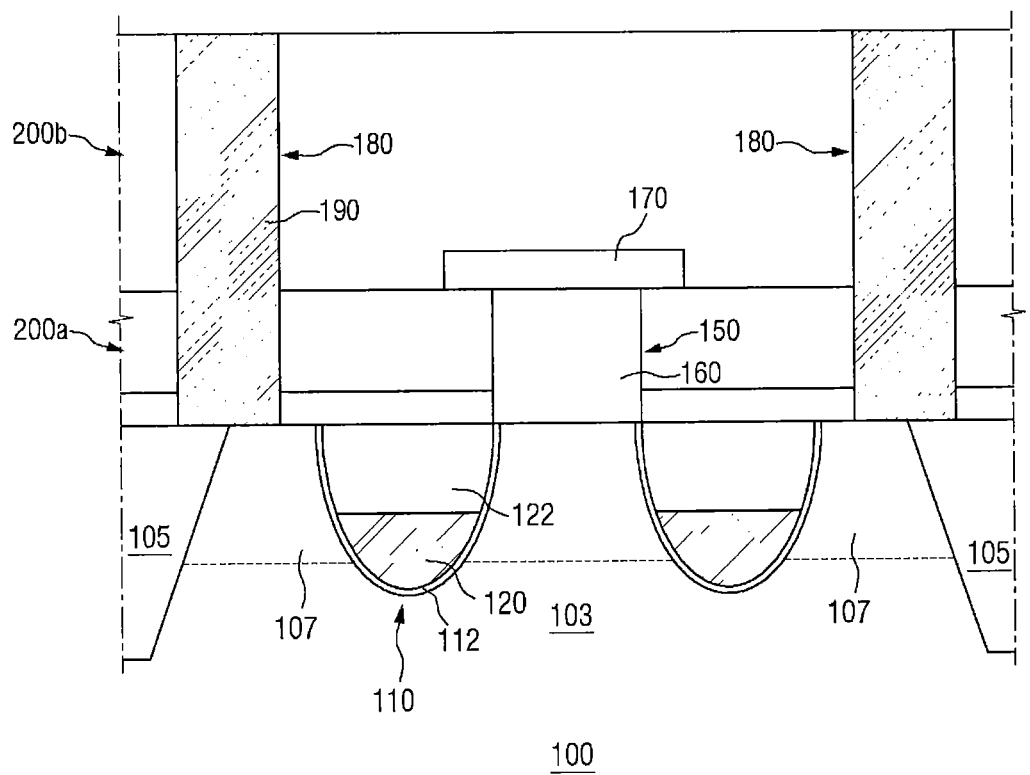

FIG. 31 illustrates an example in which the contact plug holes 180 expose both the active region 103 and the isolation layers 105, but the inventive concepts are not limited to this example. That is, the contact plug holes 180 may be formed to expose only the active regions 103.

Referring to FIG. 31, metal contact plugs 190 may be formed in the contact plug holes 180.

The metal contact plugs 190 may contain a conductive material. For example, the metal contact plugs 190 may contain polysilicon, a metal silicide compound, conductive metal nitride and/or a metal, but the inventive concepts are not limited thereto.

Figure 32:
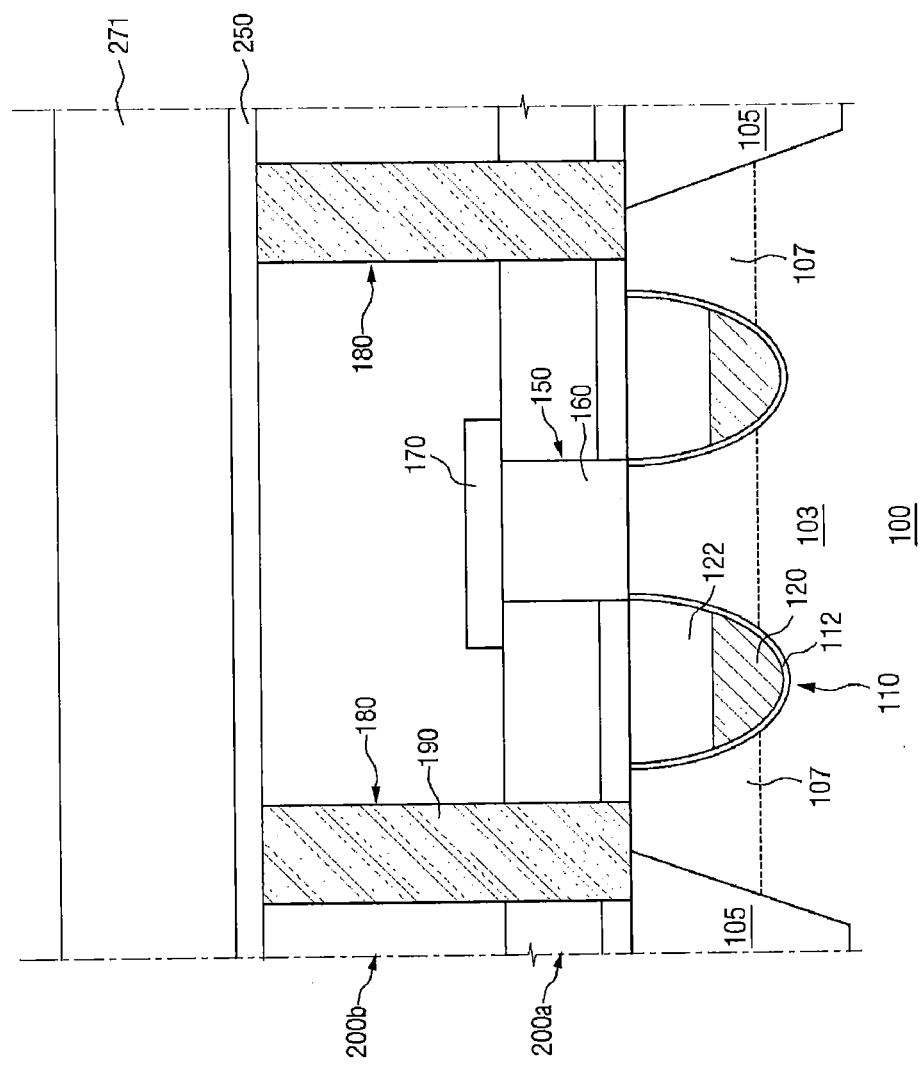

Thereafter, referring to FIG. 32, an etch stop layer 250 and a mold oxide layer 271 are formed.

More specifically, the etch stop layer 250 is formed on, and in some, embodiments to cover, the first and second interlayer insulating layers 200a and 200b and the metal contact plugs 190. The etch stop layer 250 may be formed of a material having a low etch rate and may serve as an end point layer for an etching process. In the example embodiment of FIGS. 4 through 38, the etch stop layer 250 may contain, for example, SiON and/or SiN. The etch stop layer 250 may not be provided in some embodiments.

Thereafter, the mold oxide layer 271 is formed on the etch stop layer 250. The mold oxide layer 271 may be patterned later into trenches for forming lower electrodes 300. The mold oxide layer 271 may be formed to have a sufficient height to form sufficiently long lower electrodes 300.

Figure 33:
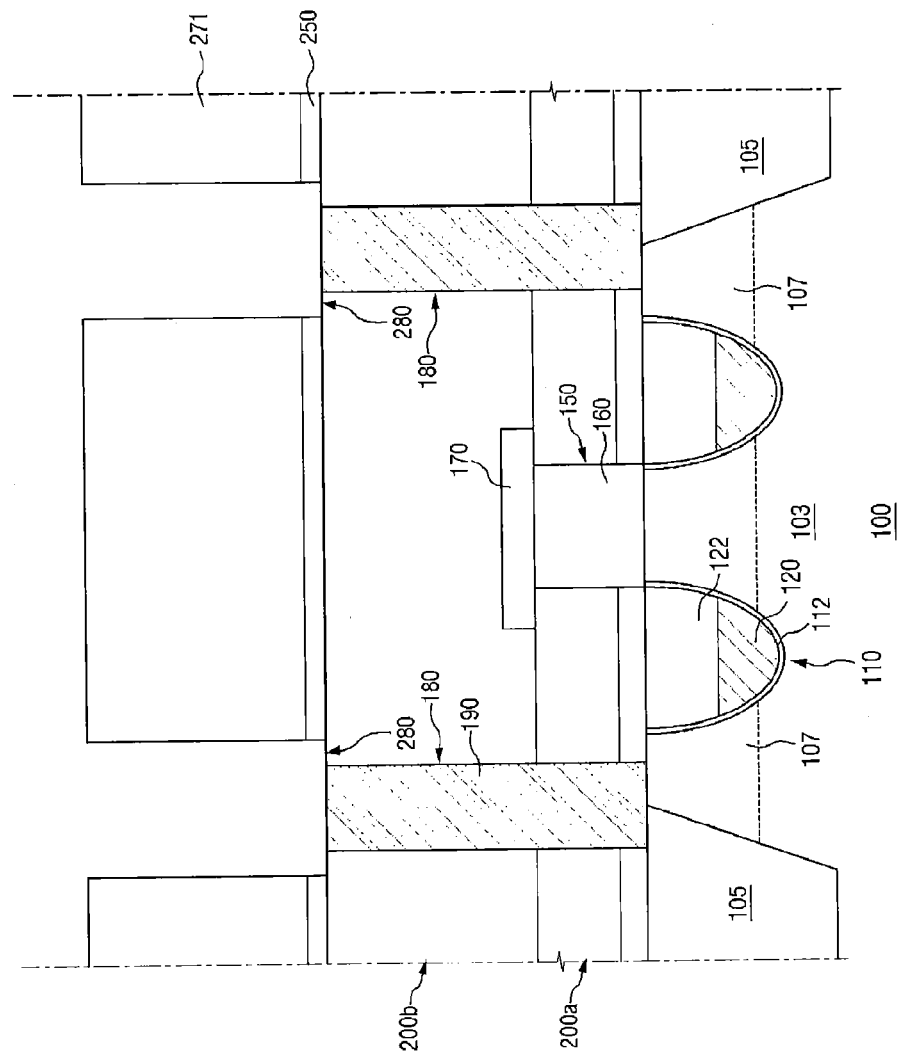

Thereafter, referring to FIG. 33, by etching the mold oxide layer 271 and the etch stop layer 250, lower electrode holes 280 are formed.

More specifically, the mold oxide layer 271 and the etch stop layer 250 are etched until the top surfaces of the metal contact plugs 190 are exposed. As a result, the lower electrode holes 280 are formed in the mold oxide layer 271 and the etch stop layer 250.

Figure 34:
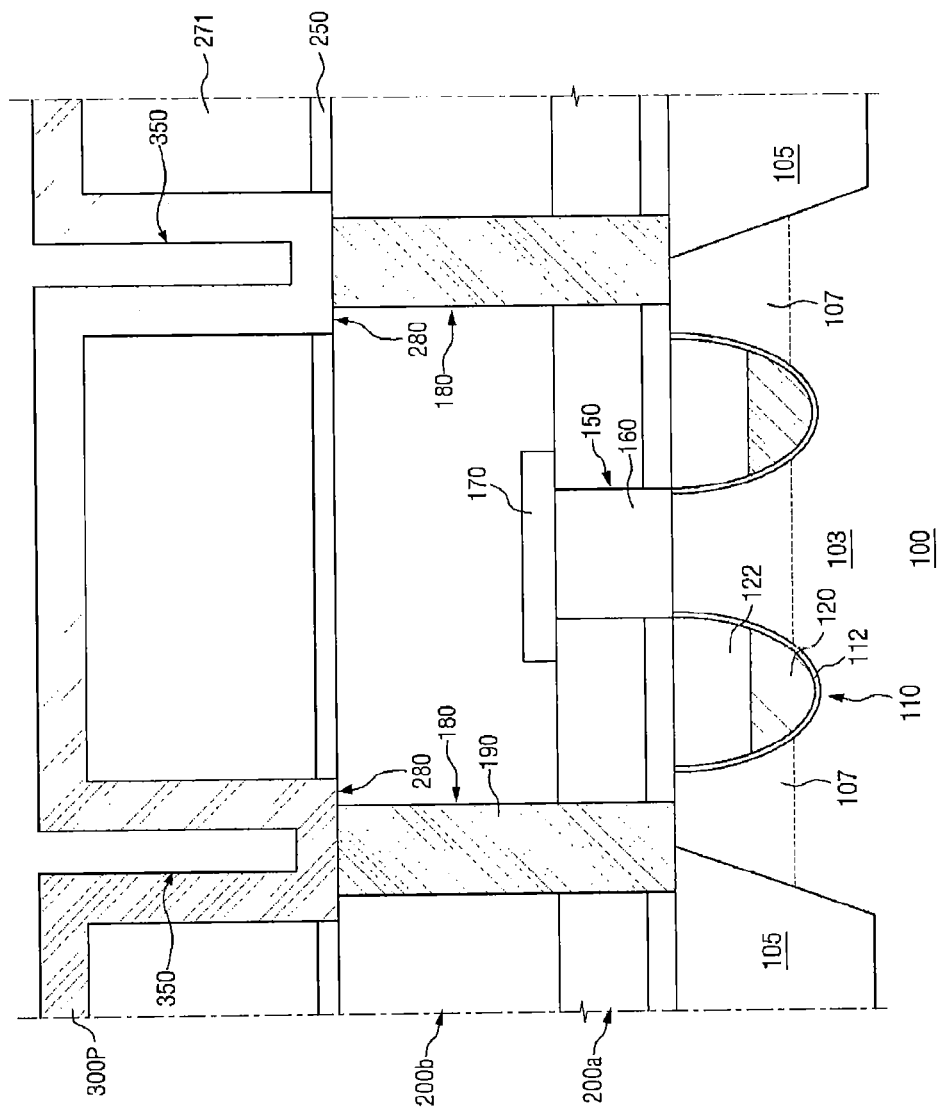

Referring to FIG. 34, a lower electrode layer 300p is formed on, and in some embodiments to cover, the lower electrode holes 280 and the mold oxides 271.

As illustrated in FIG. 34, the lower electrode layer 300p may be conformally formed on the mold oxides 271. For example, CVD and/or ALD may be used to form the lower electrode layer 300p, but the inventive concepts are not limited thereto.

Since the lower electrode layer 300p is formed to conform to the shape of the mold oxides 271, upper trenches 350 may be formed on the lower electrode layer 300p, as illustrated in FIG. 34.

The lower electrode layer 300p may be formed of a first conductive material. For example, the first conductive material may comprise TiN, TaN, W, Ru, and/or Pt, but the inventive concepts are not limited thereto.

Figure 35:
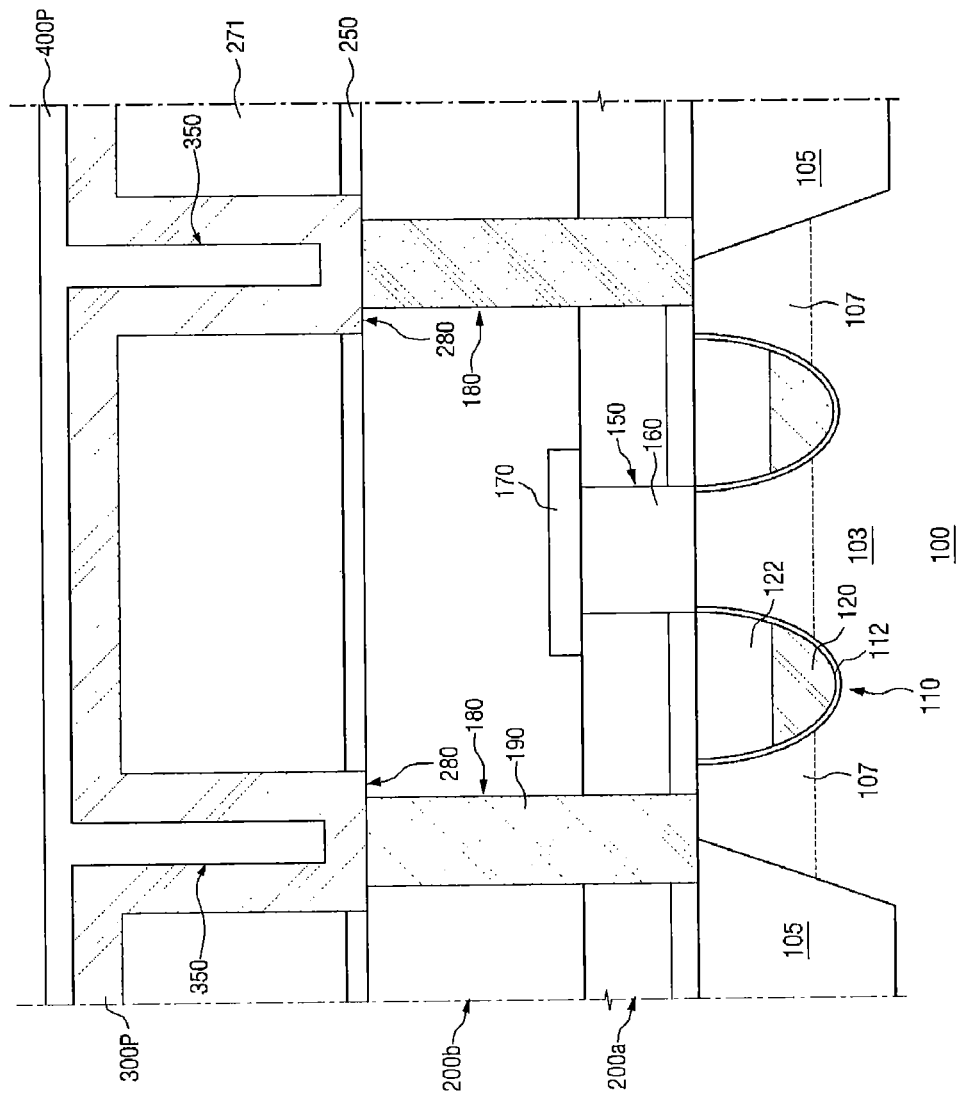

Thereafter, referring to FIG. 35, a supporter layer 400p is formed in, and in some embodiments to completely fill the upper trenches 350. The supporter layer 400p may also be formed on, and in some embodiments to cover, the top surface of the lower electrode layer 300p. The supporter layer 400p may contain a conductive material.

Figure 36:
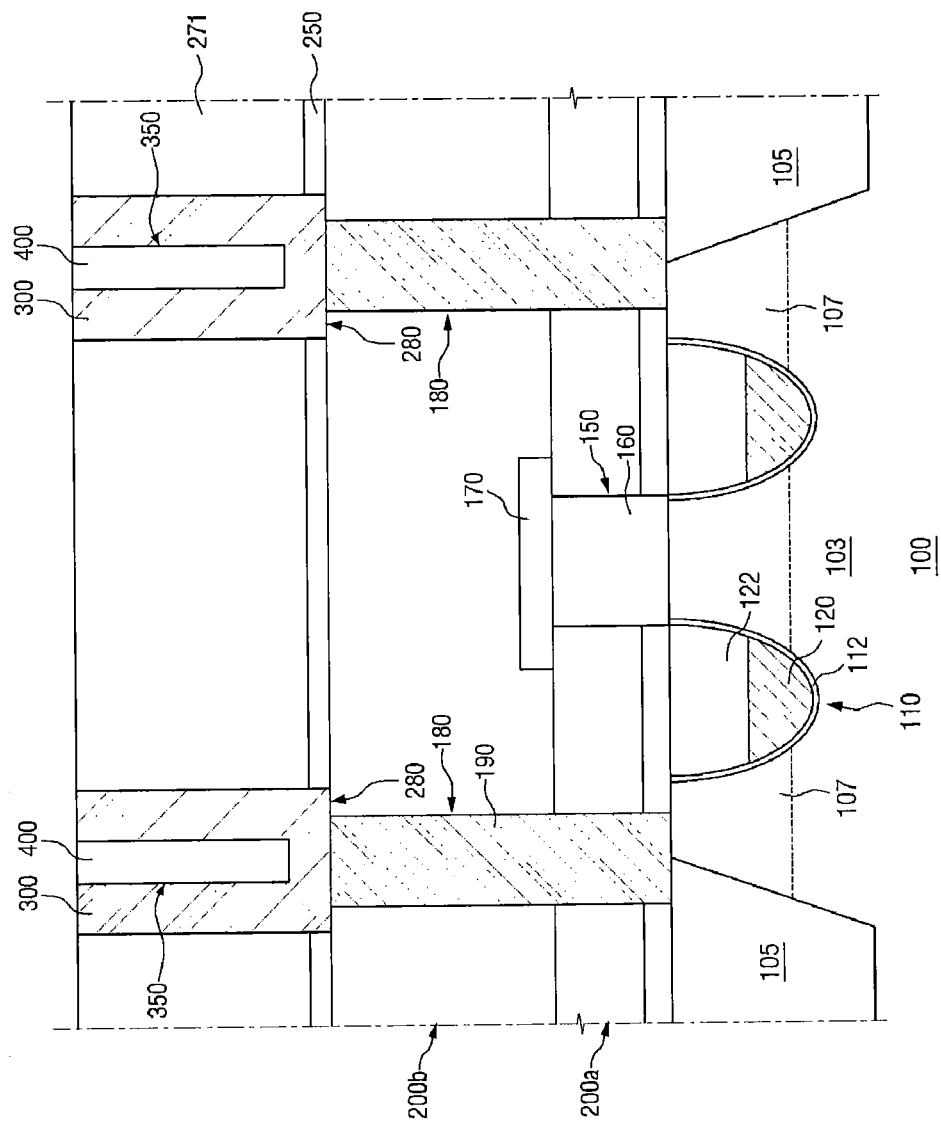

Thereafter, referring to FIG. 36, the lower electrode layer 300p and the supporter layer 400p may be etched until the top surfaces of the mold oxides 271 are exposed. As a result of the etching of the lower electrode layer 300p and the supporter layer 400p, node separation between cells may be accomplished.

The etching of the lower electrode layer 300p and the supporter layer 400p may be performed using CMP. In response to an upper part of the lower electrode layer 300p being etched away, lower electrodes 300 may be formed. In response to an upper part of the supporter layer 400p being etched away, supporters 400 may be formed. The top surfaces of the supporters 400 may be on the same plane as the top surfaces of the lower electrodes 300. The expression "on the same plane", as used herein, may even encompass an example in which there is a slight height difference between the top surfaces of the supporters 400 and the top surfaces of the lower electrodes 300.

Figure 37:
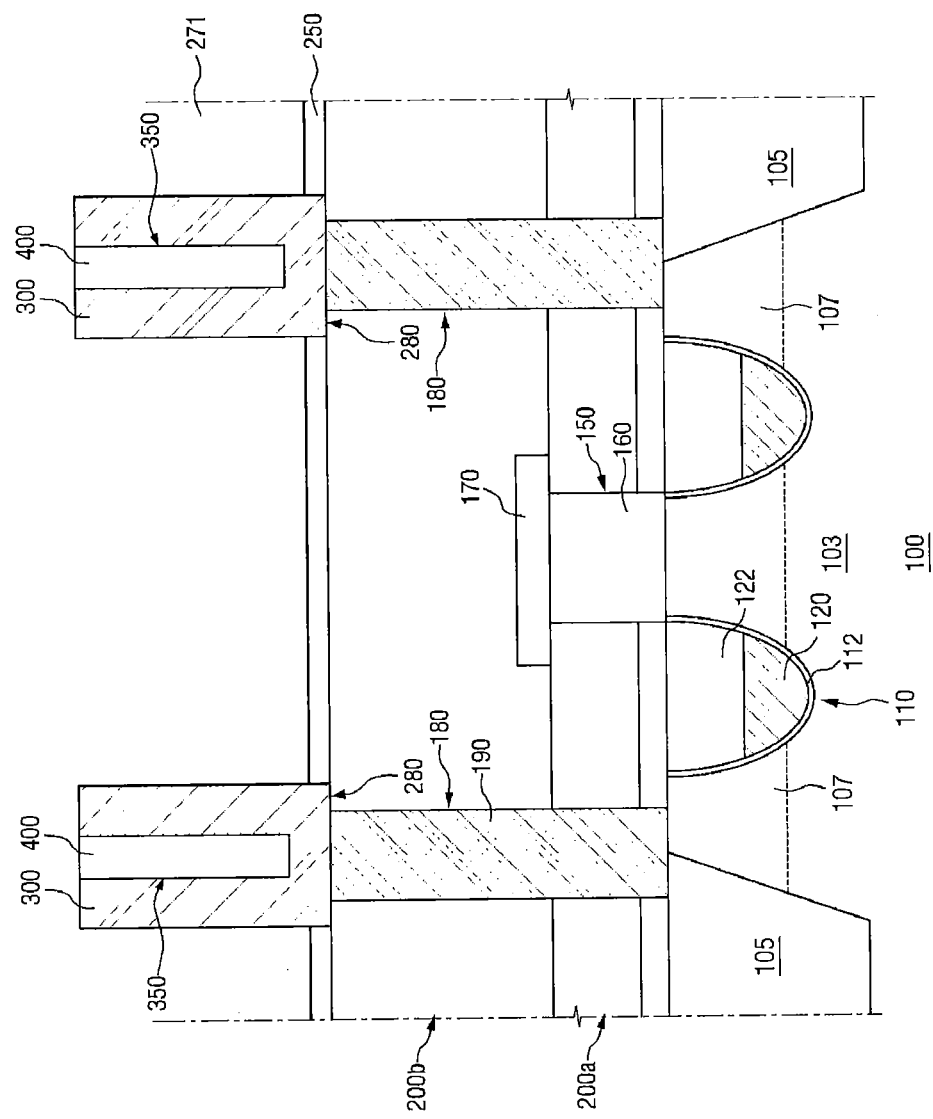

Thereafter, referring to FIG. 37, the remaining mold oxides 271 are all etched away. Accordingly, only the etch stop layer 250 may remain on the sides of each of the lower electrodes 300, and thus, the outer walls of each of the lower electrodes 300 may be exposed. Accordingly, there is a risk that the lower electrodes 300 may collapse or may be partly peeled off due to thermal or mechanical stress applied thereto. However, in the example embodiment of FIGS. 4 through 38, the supporters 400 are provided to reduce or prevent the collapse of the lower electrodes 300. The supporters 400 may not be provided in other embodiments.

Figure 38:
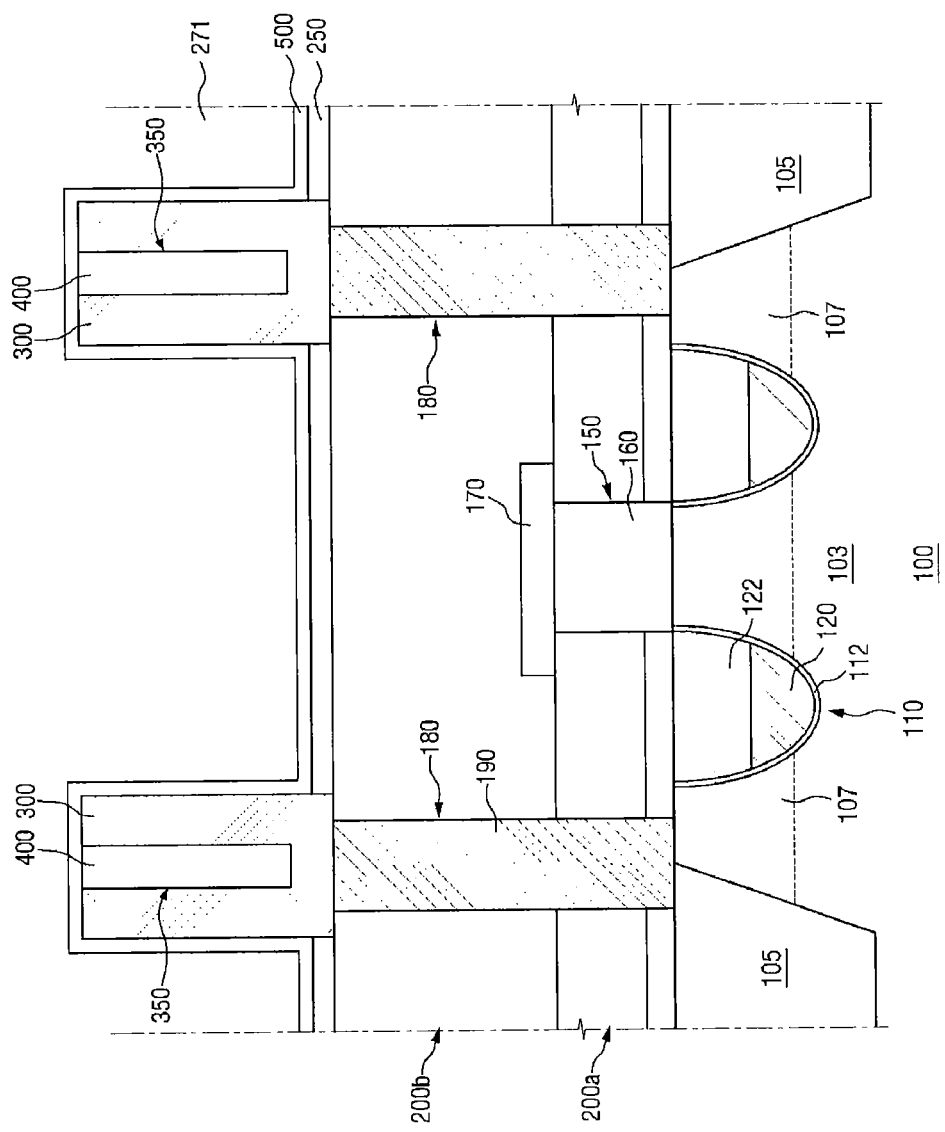

Thereafter, referring to FIG. 38, a dielectric layer 500 may be formed on, and in some embodiments to cover, the etch stop layer 250, the lower electrodes 300, and the supporters 400. The dielectric layer 500 may be formed of $Al_2O_3$, $HfO_2$, a lanthanum-based oxide, $ZrO_2$, $Ta_2O_5$, $TiO_2$, $SrTiO_3$, $BaSrTiO_3$, and/or a combination thereof.

Thereafter, referring again to FIGS. 1 and 38, an upper electrode 600 may be formed on the dielectric layer 500. The upper electrode 600 may be formed of TiN, TaN, W, Ru, and/or Pt.

The lower electrodes 300, the dielectric layer 500, and the upper electrode 600 may form capacitors together and may thus serve as memory devices. In the example embodiment of FIGS. 4 through 38, the capacitors may be used to serve as the memory devices of DRAMs, but the inventive concepts are not limited thereto. That is, the example embodiment of FIGS. 4 through 38 may be also applicable to the manufacture of typical capacitors and/or other microelectronic devices.

A manufacturing method of a semiconductor device, according to another example embodiment of the inventive concepts, will hereinafter be described with reference to FIGS. 39 and 40.

Figure 39:
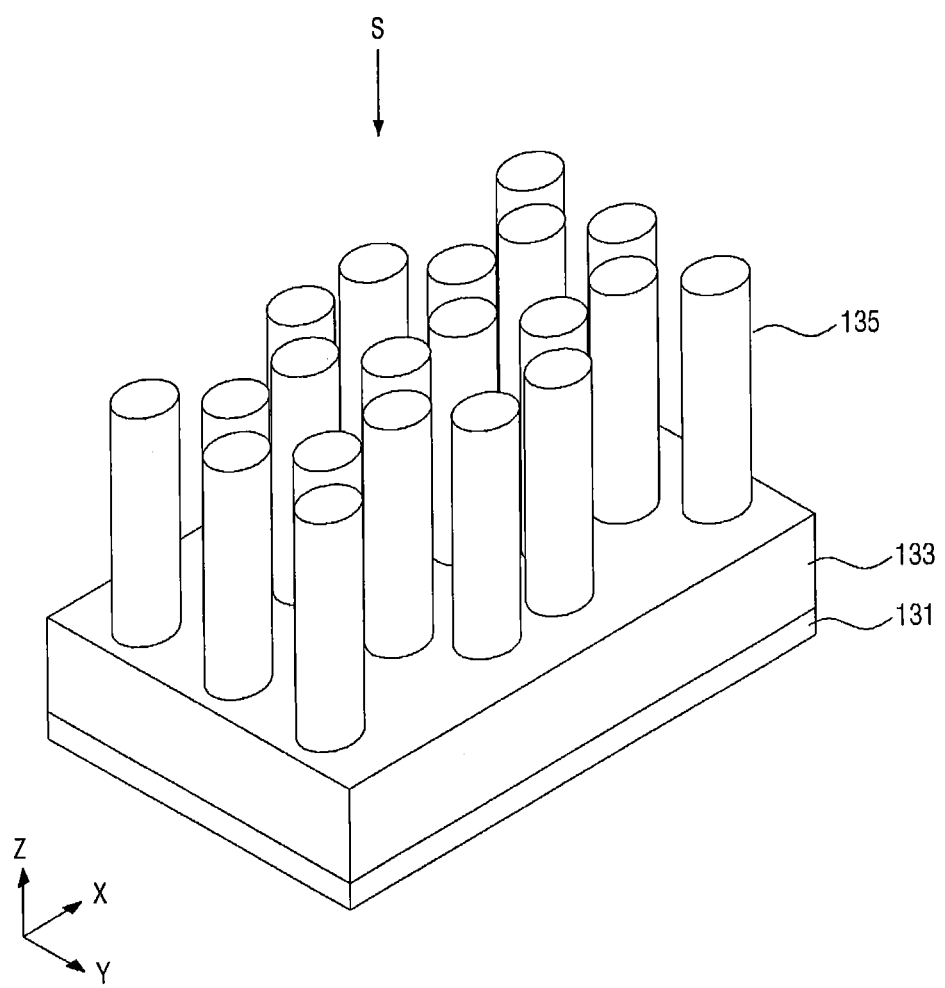
FIGS. 39 and 40 illustrate intermediate steps of a manufacturing method of a semiconductor device, according to other example embodiments of the inventive concepts.
Figure 40:
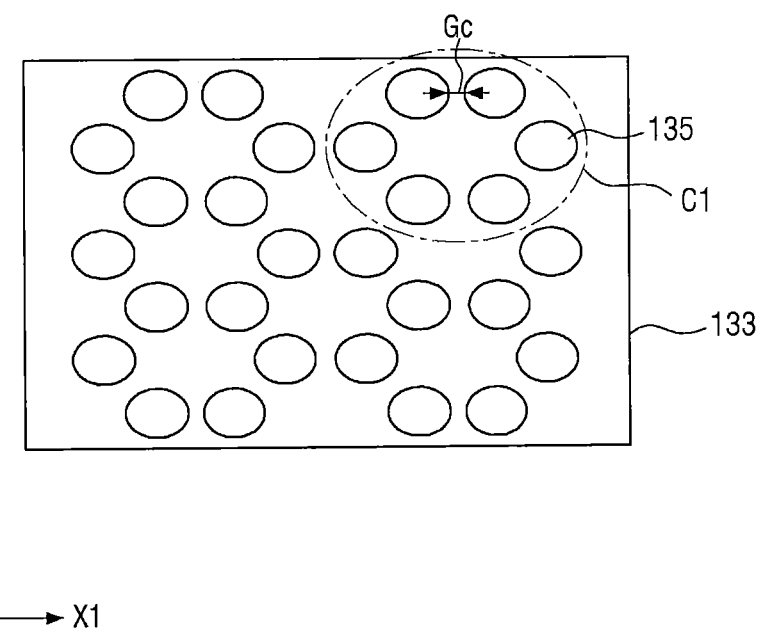

FIGS. 39 and 40 are schematic views illustrating intermediate steps of a manufacturing method of a semiconductor device, according to another example embodiment of the inventive concepts.

The example embodiment of FIGS. 39 and 40 is substantially the same as the example embodiment of FIGS. 4 through 38 except for the shape of each unit area. Accordingly, in FIGS. 4 through 40, like reference numerals indicate like elements, and thus, any repeated descriptions thereof will be omitted.

The intermediate step of FIG. 40 may correspond to the intermediate step of FIG. 13, as performed in the manufacturing method according to the example embodiment of FIGS. 4 through 38. Accordingly, the intermediate steps followed by the intermediate step of FIG. 40 may be replaced with the intermediate steps of FIGS. 3 through 12.

FIG. 39 is a perspective view of an intermediate step of a manufacturing method of a semiconductor device, according to another example embodiment of the inventive concepts, and FIG. 40 is a perspective view of FIG. 39 as seen from a direction S.

Referring to FIGS. 39 and 40, a hexagonal arrangement of pillar masks 135 may be provided in a unit area C1.

The pillar masks 135 at the vertices of the hexagon may be spaced from one another by a second distance Gc. In the example embodiment of FIGS. 4 through 38, the spacers 137 may be merged or contact one another in the regions where the pillar masks 135 are spaced from one another by the second gap Gc, and thus, the mask bridges 137a may be formed. In the example embodiment of FIGS. 39 and 40, an etching area a surrounded by the mask bridges 137a and the pillar masks 135 in the unit area C1 may be hexagonal.

Thereafter, the operations of FIGS. 17 through 38 may be performed, thereby obtaining a semiconductor device. The semiconductor device obtained by the manufacturing method according to the example embodiment of FIGS. 39 and 40 may include contact holes 150 having hexagonal top surfaces and bit line contacts 160 having hexagonal top surfaces.

The example embodiment of FIGS. 4 through 38 and the example embodiment of FIGS. 39 and 40 are merely examples and are not for limiting the shape of the contact holes 150 and the shape of the bit line contacts 160. That is, the contact holes 150 may be formed in various shapes, other than those set forth herein, by using various arrangements of the pillar masks 135 and the mask bridges 137a, which are obtained from the spacers 137.

A semiconductor device according to another example embodiment of the inventive concepts will hereinafter be described with reference to FIG. 41.

Figure 41:
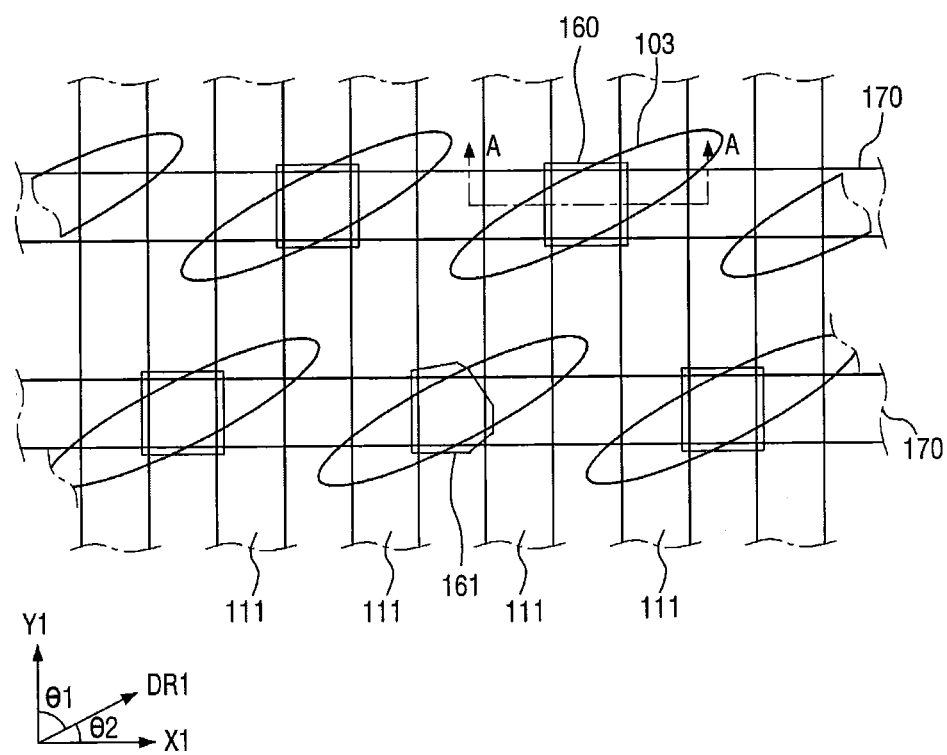
FIG. 41 is a layout view of a semiconductor device according to other example embodiments of the inventive concepts.

The semiconductor device according to the example embodiment of FIG. 41 is substantially the same as the semiconductor device 1 according to the example embodiment of FIGS. 1 through 3 except that it includes bit line contacts having non-rectangular top surfaces. Accordingly, in FIGS. 1 through 3 and 41, like reference numerals indicate like elements, and thus, any repeated descriptions thereof will be omitted.

FIG. 41 is a layout view of a semiconductor device according to another example embodiment of the inventive concepts.

Referring to FIG. 41, the semiconductor device may include bit line contacts 160, which are rectangular, and bit line contacts 161, which are non-rectangular.

The non-rectangular bit line contacts 161 may be formed due to the misalignment or collapse of pillar masks 135 during the manufacture of the semiconductor device. The bit line contacts 161 may be regularly arranged in a lattice form, but the arrangement of the bit line contacts 161 is not particularly limited.

Figure 42:
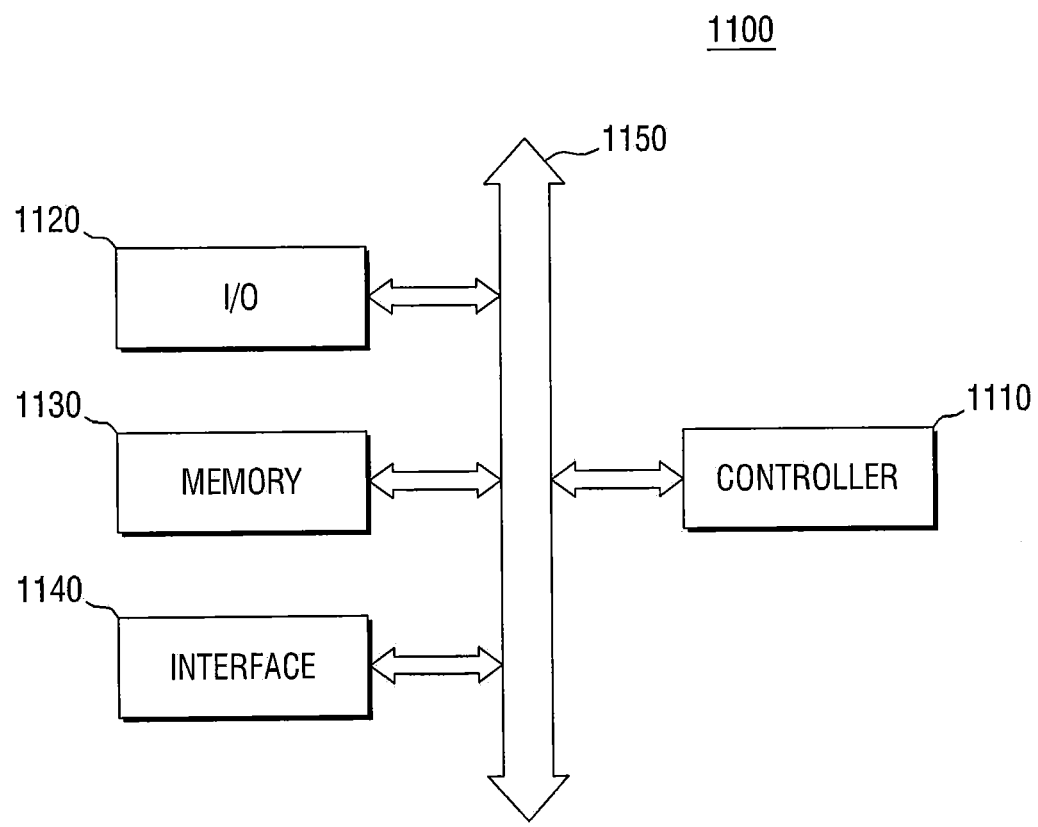
FIG. 42 is a block diagram of an electronic system including a semiconductor device obtained by a manufacturing method of a semiconductor device, according to some example embodiments of the inventive concepts.

FIG. 42 is a block diagram of an electronic system including a semiconductor device obtained by a manufacturing method of a semiconductor device, according to some example embodiments of the inventive concepts.

Referring to FIG. 42, an electronic system 1100 may include a controller 1110, an input/output (I/O) device 1120, a memory device 1130, an interface 1140, and a bus 1150. The controller 11100, the I/O device 1120, the memory device 1130 and/or the interface 1140 may be connected to each other through the bus 1150. The bus 1150 corresponds to a path through which data is transferred.

The controller 1110 may include a microprocessor, a digital signal processor, a microcontroller, and/or logic elements that can perform similar and/or other functions. The I/O device 1120 may include a keypad, a keyboard, and a display device. The memory device 1130 may store data and/or commands. The interface 1140 may transmit data to, or receive data from, a communication network. The interface 1140 may be of a wired and/or wireless type. For example, the interface 1140 may include an antenna or a wire/wireless transceiver. Although not specifically illustrated, the electronic system 1100 may include a high-speed DRAM and/or Static Random Access Memory (SRAM) as an operating memory for improving the operation of the controller 1110. A semiconductor device obtained by the manufacturing method according to some example embodiments of the inventive concepts may be provided inside the memory device 1130 or may be provided as part of the controller 1110, the I/O device 1120 and/or the interface 1140.

The electronic system 1100 may be applicable to a Personal Digital Assistant (PDA), a portable computer, a web tablet, a wireless phone, a smart phone, a mobile phone, a digital music player, a memory card, and/or any type of electronic product capable of transmitting and/or receiving information in a wireless environment.

Figure 43:
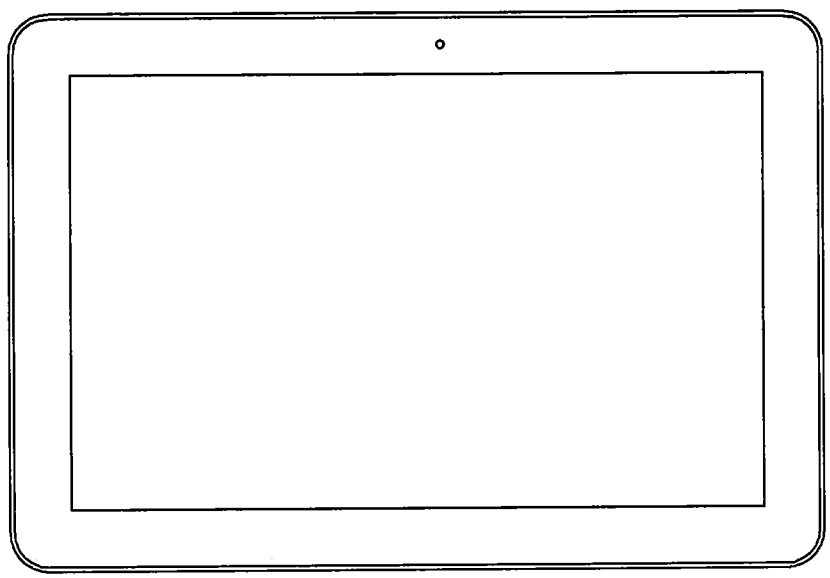
FIG. 43 is a schematic view of an example semiconductor system to which the semiconductor device obtained by the manufacturing method according to some example embodiments of the inventive concepts is applicable.

FIG. 43 is a schematic view of an example semiconductor system to which the semiconductor device obtained by the manufacturing method according to some example embodiments of the inventive concepts are applicable. More specifically, FIG. 43 illustrates a tablet PC. The semiconductor device obtained by the manufacturing method according to some example embodiments of the inventive concepts may be used in a tablet PC and/or a notebook computer. However, the semiconductor device obtained by the manufacturing method according to some example embodiments of the inventive concepts may also be used in various integrated circuit (IC) devices other than those set forth herein.

The example embodiments of the inventive concepts have been described with reference to the accompanying drawings. However, those skilled in the art will appreciate that many variations and modifications can be made to the disclosed embodiments without substantially departing from the principles of the inventive concepts. Therefore, the disclosed embodiments of the inventive concepts are used in a generic and descriptive sense only and not for purposes of limitation.

What is claimed is:

1. A fabrication method of a semiconductor device, comprising:
    forming an isolation layer and an active region, which is defined by the isolation layer, on a substrate;
    forming an insulating layer on the isolation layer and the active region;
    forming a plurality of pillar masks, which are spaced from one another by a first gap and a second gap that is smaller than the first gap, on the insulating layer;
    forming spacers on the plurality of pillar masks;
    forming mask bridges in regions where the plurality of pillar masks are spaced from one another by the second gap by partially removing the spacers; and
    forming a contact hole, which exposes the active region, by etching the insulating layer using the plurality of pillar masks and the mask bridges.

2. The fabrication method of claim 1, wherein the forming the spacers comprises conformally forming the spacers on the plurality of pillar masks.

3. The fabrication method of claim 2, wherein the forming the spacers comprises forming the spacers to be merged in the regions where the plurality of pillar masks are spaced from one another by the second gap.

4. The fabrication method of claim 3, wherein the forming the mask bridges comprises forming the mask bridges using the spacers that are merged.

5. The fabrication method of claim 2, wherein the spacers have a first thickness and the second gap is 2 times or less than the first thickness.

6. The fabrication method of claim 1, wherein the forming the plurality of pillar masks comprises forming first through fourth pillar masks, which are adjacent to one another, and the forming the first through fourth pillar masks comprises forming the first and second pillar masks in a first direction and forming the third and fourth pillar masks in a second direction, which is perpendicular to the first direction.

7. The fabrication method of claim 6, wherein the first gap includes a first direction gap and a second direction gap, which is smaller than the first direction gap, the first direction gap extending between the first and second pillar masks, and the second direction gap extending between the third and fourth pillar masks.

8. The fabrication method of claim 1, wherein the plurality of pillar masks comprise circular pillars, elliptical pillars and/or rectangular pillars with rounded corners.

9. The fabrication method of claim 8, wherein the plurality of pillar masks are rectangular pillars with rounded corners and comprise a pair of adjacent pillar masks having their respective corners facing each other and a pair of adjacent pillar masks having their respective sides facing each other.

10. The fabrication method of claim 9, wherein the first gap is a gap between the pair of adjacent pillar masks having their respective corners facing each other and the second gap is a gap between the pair of adjacent pillar masks having their respective sides facing each other.

11. A fabrication method of a semiconductor device, comprising:
    forming an isolation layer and an active region, which is defined by the isolation layer, on a substrate;
    forming an insulating layer on the isolation layer of the active region;
    forming first through fourth pillar masks, which surround an area of the insulating layer and are spaced from one another by a first gap and a second gap that is smaller than the first gap, on the insulating layer;
    forming spacers on the first through fourth pillar masks;
    forming mask bridges in regions where the first through fourth pillar masks are spaced from one another by the second gap by partially removing the spacers; and
    forming a contact hole, which exposes the active region, by etching the insulating layer using the first through fourth pillar masks and the mask bridges,
    wherein the forming the contact hole comprises forming a rectangular contact hole by etching a top surface of the area of the insulating layer that is exposed by the first through fourth pillar masks and the mask bridges.

12. The fabrication method of claim 11, wherein the forming the first through fourth pillar masks comprises forming the first and second pillar masks in a first direction and forming the third and fourth pillar masks in a second direction, which is perpendicular to the first direction.

13. The fabrication method of claim 12, wherein the first gap includes a first direction gap and a second direction gap, which is smaller than the first direction gap, the first direction gap extending between the first and second pillar masks, and the second direction gap extending between the third and fourth pillar masks.

14. The fabrication method of claim 12, wherein the first through fourth pillar masks are rectangular pillars with rounded corners, the first and second pillar masks have their respective corners facing each other, and the third and fourth pillar masks have their respective sides facing each other.

15. The fabrication method of claim 13 further comprising:
    forming a bit line contact in the contact hole; and
    forming a bit line on the bit line contacts.

16. A fabrication method of a semiconductor device, comprising:
    forming an insulating layer on a substrate;
    forming a plurality of spaced apart pillar masks on the insulating layer, a given pillar mask being spaced apart from a first pillar mask that is adjacent thereto by a first distance and being spaced apart from a second pillar mask that is adjacent thereto by a second distance that is greater than the first distance;
    forming a mask bridge that bridges the first distance so as to connect the given pillar mask to the first pillar mask but does not bridge the second distance so that the given pillar mask is not connected to the second pillar mask by the mask bridge; and
    etching the insulating layer using the plurality of spaced apart pillar masks and the mask bridge as an etch mask to form a contact hole in the insulating layer.

17. The fabrication method of claim 16 wherein the forming a mask bridge comprises:
    forming a spacer layer that is at least one half as thick as the first distance, conformally on the plurality of spaced apart pillar masks; and
    partially removing the spacer layer so that the spacer layer remains between the given pillar mask and the first pillar mask but does not remain between the given pillar mask and the second pillar mask.

18. The fabrication method of claim 16 wherein the given, first and second pillar masks are rectangular pillar masks having sides and corners, wherein a side of the given pillar mask faces a side of the first pillar mask to define the first distance and wherein a corner of the given pillar mask faces a corner of the second pillar mask to define the second distance.

19. The fabrication method of claim 16 wherein the given, first and second pillar masks are elliptical pillar masks having major axes that all extend along a first direction and minor axes that all extend along a second direction that is different from the first direction, wherein the first distance does not extend along the first direction or the second direction and wherein the second distance extends along the first direction or the second direction.

20. The fabrication method of claim 16 further comprising:
    forming a bit line contact of a memory device in the contact hole.

* * * * *